US008923354B2

(12) United States Patent
Kyono et al.

(10) Patent No.: US 8,923,354 B2
(45) Date of Patent: *Dec. 30, 2014

(54) NITRIDE SEMICONDUCTOR LASER, EPITAXIAL SUBSTRATE

(71) Applicants: Sumitomo Electric Industries, Ltd., Osaka (JP); Sony Corporation, Tokyo (JP)

(72) Inventors: Takashi Kyono, Osaka (JP); Yohei Enya, Itami (JP); Takamichi Sumitomo, Itami (JP); Yusuke Yoshizumi, Itami (JP); Masaki Ueno, Itami (JP); Katsunori Yanashima, Kanagawa (JP); Kunihiko Tasai, Tokyo (JP); Hiroshi Nakajima, Kanagawa (JP)

( * ) Notice: Subject to any disclaimer, the term of this patent is extended or adjusted under 35 U.S.C. 154(b) by 83 days.

This patent is subject to a terminal disclaimer.

(21) Appl. No.: 13/644,478

(22) Filed: Oct. 4, 2012

(65) Prior Publication Data
US 2013/0177035 A1 Jul. 11, 2013

(30) Foreign Application Priority Data

Jan. 5, 2012 (JP) .................................. 2012-000760

(51) Int. Cl.
*H01S 5/00* (2006.01)
(Continued)

(52) U.S. Cl.
CPC ............. *H01S 5/30* (2013.01); *H01L 21/02389* (2013.01); *H01S 5/3201* (2013.01);
(Continued)

(58) Field of Classification Search
CPC ... H01S 5/0211; H01S 5/3013; H01S 5/3054; H01S 5/32341; H01S 5/3403–5/3406; H01S 5/3211; H01S 5/3218; H01S 5/2009; H01S 5/3213; H01S 5/2031; H01S 5/34333

USPC ............................................ 372/43.01, 44.01
See application file for complete search history.

(56) References Cited

U.S. PATENT DOCUMENTS

2008/0315243 A1* 12/2008 Ueno et al. ..................... 257/101
2010/0189148 A1* 7/2010 Kyono et al. ................ 372/45.01
(Continued)

FOREIGN PATENT DOCUMENTS

JP 08-125261 A 5/1996
JP 10-173227 A 6/1998
(Continued)

OTHER PUBLICATIONS

Notice of Reasons for Rejection in Japanese Patent Application No. 2012-000760, dated Oct. 9, 2012.
(Continued)

*Primary Examiner* — Colleen A Matthews
*Assistant Examiner* — Joshua King
(74) *Attorney, Agent, or Firm* — Venable LLP; Michael A. Sartori; Tamatane J. Aga

(57) ABSTRACT

A nitride semiconductor laser comprises a conductive support base having a primary surface of gallium nitride based semiconductor, an active layer on the primary surface, and a p-type cladding region on the primary surface. The primary surface is tilted to a reference plane perpendicular to a reference axis extending in the c-axis direction of the gallium nitride based semiconductor. The p-type cladding region comprises a first p-type group III nitride semiconductor layer of an AlGaN layer anisotropically-strained, and a second p-type group III nitride semiconductor layer of material different from the AlGaN layer. The first p-type group III nitride semiconductor layer is provided between the second p-type group III nitride semiconductor layer and the active layer. The AlGaN layer has the largest bandgap in the p-type cladding region. The second p-type group III nitride semiconductor layer has a resistivity lower than the first p-type group III nitride semiconductor layer.

24 Claims, 8 Drawing Sheets

(51) Int. Cl.
    *H01S 5/30*     (2006.01)
    *H01S 5/32*     (2006.01)
    *H01S 5/343*     (2006.01)
    *H01L 21/02*     (2006.01)
    *H01S 5/22*     (2006.01)
    *H01S 5/20*     (2006.01)

(52) U.S. Cl.
    CPC ........... *H01L 21/0254* (2013.01); *H01S 5/3063* (2013.01); *H01S 2304/04* (2013.01); *H01L 21/02458* (2013.01); *H01S 5/22* (2013.01); *H01L 21/02433* (2013.01); *H01S 5/3213* (2013.01); *H01S 5/3202* (2013.01); *H01S 5/34333* (2013.01); *H01S 5/2031* (2013.01)
    USPC ..................................... 372/44.01; 372/43.01

(56) References Cited

U.S. PATENT DOCUMENTS

| | | | |
|---|---|---|---|
| 2011/0007766 A1* | 1/2011 | Farrell et al. ............... | 372/45.01 |
| 2011/0013656 A1* | 1/2011 | Akita et al. ............... | 372/45.01 |
| 2011/0013657 A1* | 1/2011 | Sumitomo et al. .......... | 372/45.01 |
| 2011/0182311 A1* | 7/2011 | Yoshizumi et al. ....... | 372/44.011 |
| 2011/0188528 A1* | 8/2011 | Kisin et al. ................ | 372/44.011 |
| 2012/0269222 A1* | 10/2012 | Kyono et al. ............ | 372/45.011 |

FOREIGN PATENT DOCUMENTS

| | | | | |
|---|---|---|---|---|
| JP | 2008-543089 A | 11/2008 | | |
| JP | 2009-206533 A | 9/2009 | | |
| JP | 2010-129676 A | 6/2010 | | |
| JP | 2010-192865 A | 9/2010 | | |
| JP | 2010263161 A | * 11/2010 | ............. | H01S 5/343 |
| JP | 2011-023539 A | 2/2011 | | |
| JP | 2011-044669 A | 3/2011 | | |
| WO | WO-2010/131527 A1 | 11/2010 | | |

OTHER PUBLICATIONS

International Search Report in International Patent Application No. PCT/JP2012/073917, dated Oct. 16, 2012.

International Preliminary Report on Patentability and Written Opinion in PCT International Application No. PCT/JP2012/073917, dated Jul. 17, 2014.

* cited by examiner

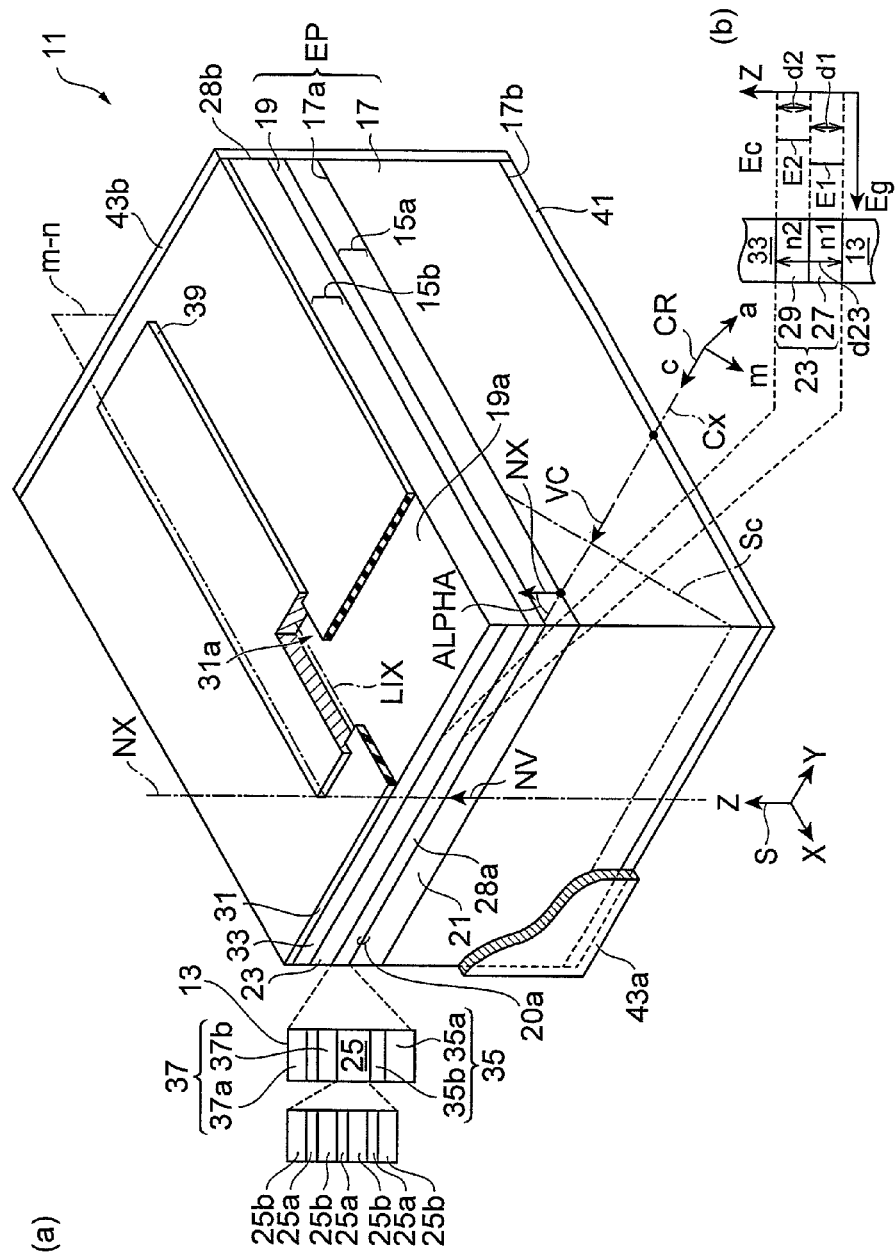

| P-TYPE CLADDING REGION | STRAIN | RESISTIVITY |
|---|---|---|
| NITRIDE SEMICONDUCTOR LAYER 29 | STRAINED / NOT STRAINED | LOW |
| NITRIDE SEMICONDUCTOR LAYER 27 | STRAINED | HIGH |

(b)

| P-TYPE CLADDING REGION | STRAIN | RESISTIVITY | Eg |
|---|---|---|---|
| NITRIDE SEMICONDUCTOR LAYER 29 | STRAINED / NOT STRAINED | LOW | SMALL |
| NITRIDE SEMICONDUCTOR LAYER 27 | STRAINED | HIGH | LARGE |

(c)

| P-TYPE CLADDING REGION | STRAIN | RESISTIVITY | Eg | Mg CONCENTRATION |
|---|---|---|---|---|
| NITRIDE SEMICONDUCTOR LAYER 29 | STRAINED / NOT STRAINED | LOW | SMALL | HIGH |
| NITRIDE SEMICONDUCTOR LAYER 27 | STRAINED | HIGH | LARGE | LOW |

Fig.3
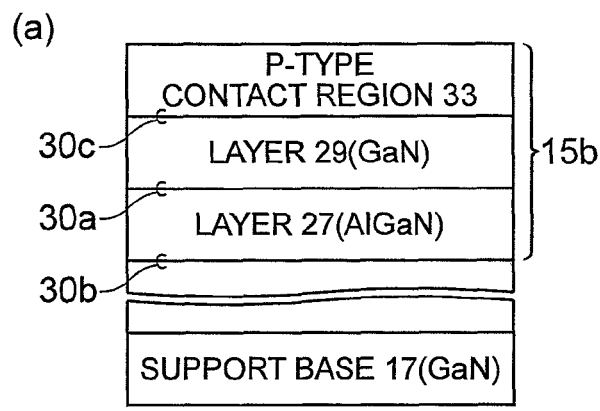
(a)
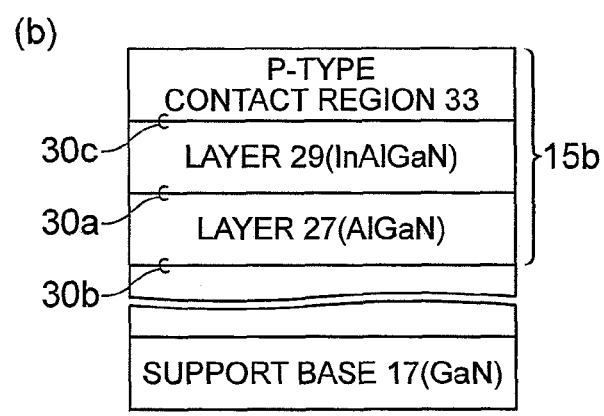
(b)
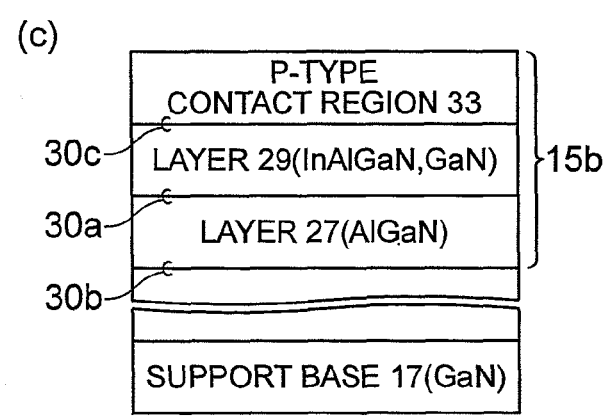
(c)

NITRIDE SEMICONDUCTOR LASER, EPITAXIAL SUBSTRATE

BACKGROUND OF THE INVENTION

1. Field of the Invention

The present invention relates to a nitride semiconductor laser and to an epitaxial substrate for nitride semiconductor lasers.

2. Related Background Art

Patent Publication 1 discloses a nitride semiconductor light-emitting device. Patent Publication 2 discloses a nitride semiconductor laser device.

Patent Publication 1: Japanese Patent Application Publication No. 2010-192865

Patent Publication 2: Japanese Patent Application Publication No. 2010-129676

SUMMARY OF THE INVENTION

Patent Publication 1 discloses a relationship between lattice constants of GaN and InAlGaN in a nitride semiconductor light emitting device. The nitride semiconductor laser device of Patent Publication 2 includes a p-type AlGaN layer, which has a thickness ranging from 8 nm to 20 nm and an Al composition ranging from 10% to 25%, and a p-type AlGaN cladding layer which has an Al composition ranging from 3% to 5%. The p-type AlGaN layer and the p-type AlGaN cladding layer are in contact with each other, and a p-type GaN contact layer is in contact with the upper surface of the p-type AlGaN cladding layer.

In the nitride semiconductor laser device disclosed in, for instance, Patent Publication 2, the Al composition of the p-type AlGaN cladding layer is smaller than the Al composition of the other p-type AlGaN layer. In order to provide the other p-type AlGaN layer with a barrier to electron, the other p-type AlGaN layer has to have a large Al composition. The AlGaN layer is in contact with the other AlGaN layer, which has an Al composition different from the AlGaN layer, and hence the AlGaN layer having a higher Al composition includes a large strain.

It is an object of one aspect of the present invention to provide a nitride semiconductor laser in which driving voltage can be reduced while preventing the reduction in optical confinement. It is an object of another aspect of the present invention to provide an epitaxial substrate for such a nitride semiconductor laser.

A nitride semiconductor laser according to one aspect of the present invention comprises: (a) a support base having conductivity, the support base including a primary surface, the primary surface comprising a gallium nitride based semiconductor; (b) an active layer provided on the primary surface; and (c) a p-type nitride semiconductor region provided on the primary surface. The primary surface is tilted with respect to a reference plane; the reference plane is perpendicular to a reference axis; the reference axis extends in a direction of a c-axis of the gallium nitride based semiconductor: the active layer is provided between the support base and the p-type nitride semiconductor region; the p-type nitride semiconductor region includes a p-type cladding region; the p-type cladding region includes a first p-type group III nitride semiconductor layer and a second p-type group III nitride semiconductor layer; the first p-type group III nitride semiconductor layer is provided between the second p-type group III nitride semiconductor layer and the active layer; the first p-type group III nitride semiconductor layer includes an AlGaN layer; the second p-type group III nitride semiconductor layer comprises material different from that of the AlGaN layer of the first p-type group III nitride semiconductor layer; the AlGaN layer includes anisotropic strain; a band gap of the AlGaN layer of the first p-type group III nitride semiconductor layer is largest at the p-type cladding region, and the second p-type group III nitride semiconductor layer has a resistivity lower than a resistivity of a first p-type group III nitride semiconductor layer.

In this nitride semiconductor laser, since the p-type cladding region comprises the first and second p-type group III nitride semiconductor layers having materials different from each other, the optical confinement properties of the p-type cladding region can be rendered superior, without using a graded composition in the first and second p-type group III nitride semiconductor layers. The first p-type group III nitride semiconductor layer is provided between the second p-type group III nitride semiconductor layer and the active layer. Holes flow through the second p-type group III nitride semiconductor layer which has lower resistivity than the first p-type group III nitride semiconductor layer, and then reach the first p-type group III nitride semiconductor layer.

Since the AlGaN layer of the first p-type group III nitride semiconductor layer has the largest band gap in the p-type cladding region, strain in the p-type cladding region can be increased in the AlGaN layer of the first p-type group III nitride semiconductor layer. Since the band gap maximum in the p-type cladding region is provided in the first p-type group III nitride semiconductor layer, the AlGaN layer can be provided with large anisotropic strain.

The AlGaN layer in the first p-type group III nitride semiconductor layer includes anisotropic strain, and hence holes in the AlGaN layer have a smaller effective mass as compared to that of AlGaN that is grown on the c-plane. Accordingly, the resistivity of the AlGaN layer of the first p-type group III nitride semiconductor layer is higher than the resistivity of the second p-type group III nitride semiconductor layer. Holes of a small effective mass, however, works as carriers for conduction in the AlGaN layer. Therefore, when the holes from the second p-type group III nitride semiconductor layer reach the first p-type group III nitride semiconductor layer and then they propagate in the first p-type group III nitride semiconductor layer, a dynamic electrical resistance in the AlGaN layer becomes lower than a value expected based on resistivity of the first p-type group III nitride semiconductor layer. As a result, the forward driving voltage is reduced.

An epitaxial substrate for a nitride semiconductor laser according to an aspect of the present invention comprises: (a) a substrate having a primary surface, the primary surface comprising a gallium nitride based semiconductor; (b) an active layer provided on the primary surface; and (c) a p-type nitride semiconductor region provided on the primary surface. The primary surface is tilted with respect to a reference plane, the reference plane being perpendicular to a reference axis, the reference axis extending in a direction of the c-axis of the gallium nitride based semiconductor; the active layer is provided between the substrate and the p-type nitride semiconductor region; the p-type nitride semiconductor region comprises a p-type cladding region; the p-type cladding region includes a first p-type group III nitride semiconductor layer and a second p-type group III nitride semiconductor layer; the first p-type group III nitride semiconductor layer is provided between the second p-type group III nitride semiconductor layer and the active layer; the first p-type group III nitride semiconductor layer comprises an AlGaN layer; the second p-type group III nitride semiconductor layer is different from the AlGaN layer of the first p-type group III nitride semiconductor layer; the AlGaN layer includes anisotropic strain; a band gap of the AlGaN layer of the first p-type group III nitride semiconductor layer is largest in the p-type cladding region; and the second p-type group III nitride semiconductor layer has a resistivity lower than a resistivity of a first p-type group III nitride semiconductor layer.

In this epitaxial substrate, the p-type cladding region includes the first and second p-type group III nitride semiconductor layers having materials different from each other. Therefore, the p-type cladding region can be provided with superior optical confinement properties without using a graded composition in the first and second p-type group III nitride semiconductor layers. Since the first p-type group III nitride semiconductor layer is provided between the second p-type group III nitride semiconductor layer and the active layer, holes conduct through the second p-type group III nitride semiconductor layer having lower resistivity than the first p-type group III nitride semiconductor layer and then reach the first p-type group III nitride semiconductor layer.

The AlGaN layer of the first p-type group III nitride semiconductor layer has the largest band gap in the p-type cladding region, and hence the strain in the p-type cladding region can be large in the AlGaN layer of the first p-type group III nitride semiconductor layer. Since the maximum of band gap in the p-type cladding region is located in the first p-type group III nitride semiconductor layer, the AlGaN layer can incorporate large anisotropic strain.

The AlGaN layer in the first p-type group III nitride semiconductor layer includes anisotropic strain, and hence holes in the AlGaN layer have a smaller effective mass as compared to that of AlGaN that is grown on the c-plane. Accordingly, the resistivity of the AlGaN layer of the first p-type group III nitride semiconductor layer is higher than the resistivity of the second p-type group III nitride semiconductor layer. Holes having a small effective mass work as carriers for conduction in the AlGaN layer. Therefore, upon conduction in the first p-type group III nitride semiconductor layer when the holes from the second p-type group III nitride semiconductor layer reach the first p-type group III nitride semiconductor layer, the dynamic electrical resistance in the AlGaN layer becomes better than a value expected based on resistivity of the first p-type group III nitride semiconductor layer, resulting in reducing the forward driving voltage.

The nitride semiconductor laser and epitaxial substrate according to the above-described aspects of the present invention may further comprise an n-type cladding region provided between the active layer and the primary surface of the support base. Preferably, the n-type cladding region comprises an InAlGaN layer; and the AlGaN layer of the first p-type group III nitride semiconductor layer has an Al composition lower than an Al composition of the InAlGaN layer of the n-type cladding region.

In the above aspects, the n-type cladding region comprises the InAlGaN layer, and hence the strain included in the InAlGaN layer of the n-type cladding region can be made smaller than the strain included in the AlGaN layer of the first p-type group III nitride semiconductor layer. Accordingly, relaxation of the InAlGaN layer of the n-type cladding region can be suppressed, and it becomes possible, as a result, to prevent the strain reduction, which may be caused by relaxation in the InAlGaN layer of the n-type cladding region, in the AlGaN layer of the first p-type group III nitride semiconductor layer.

In the nitride semiconductor laser and epitaxial substrate according to the above-described aspects of the present invention, preferably, a band gap energy of the first p-type group III nitride semiconductor layer is larger than a band gap energy of the second p-type group III nitride semiconductor layer.

Optical confinement in the p-side region can be improved in the above-described aspects.

In the nitride semiconductor laser and epitaxial substrate according to the above-described aspects of the present invention, preferably, a band gap of the first p-type group III nitride semiconductor layer ranges from 3.47 electron volts to 3.63 electron volts.

In the above aspects, the first p-type group III nitride semiconductor layer is closer to the active layer than the second p-type group III nitride semiconductor layer, and the above-described band gap value enables excellent optical confinement in the GaN-based light emitting device.

In the nitride semiconductor laser and epitaxial substrate according to the above-described aspects of the present invention, preferably, the first and second p-type group III nitride semiconductor layers are doped with magnesium (Mg), and the first p-type group III nitride semiconductor layer has a magnesium concentration lower than a magnesium concentration of the second p-type group III nitride semiconductor layer.

In the above aspects, the magnesium concentration of the first p-type group III nitride semiconductor layer close to the active layer is lower than the magnesium concentration of the second p-type group III nitride semiconductor layer, and hence it becomes possible to reduce increases in absorption loss, caused by dopant optical absorption, and decreases in mobility, caused by dopant ion scattering.

In the nitride semiconductor laser and epitaxial substrate according to the above-described aspects of the present invention, the magnesium concentration in the first p-type group III nitride semiconductor layer can be $8 \times 10^{17}$ cm$^{-3}$ or higher. The magnesium concentration within the above range can lower resistivity in the first p-type group III nitride semiconductor layer. The magnesium concentration of the first p-type group III nitride semiconductor layer can be $2 \times 10^{19}$ cm$^{-3}$ or smaller. If the magnesium concentration exceeds the above range, absorption loss caused by optical absorption of the dopants exerts a significant influence on the threshold current to increase it. Also, decreases in mobility caused by dopant ion scattering become significant.

In the nitride semiconductor laser and epitaxial substrate according to the above-described aspects of the present invention, preferably, a thickness of the p-type cladding region ranges from 300 nm to 1000 nm, and the first and second p-type group III nitride semiconductor layers have respectively thicknesses d1 and d2 such that the thickness of the second p-type group III nitride semiconductor layer satisfies $0.2 \leq d2/(d1+d2) \leq 0.6$.

In the above aspects, when the thickness of the second p-type group III nitride semiconductor layer has a value within the above range, the second p-type group III nitride semiconductor layer enables excellent optical confinement and low driving voltage, together with the first p-type group III nitride semiconductor layer that has the remaining thickness. The low resistivity of the second p-type group III nitride semiconductor layer, which has a thickness in the abovementioned range, helps reduce the driving voltage, and the low effective mass of the first p-type group III nitride semiconductor layer, which has the remaining thickness of the abovementioned range, helps likewise reduce the driving voltage. The first and second p-type group III nitride semiconductor layers, which have thickness in the abovementioned range, are larger than the thickness of the contact region that is needed to form good contact with the electrode.

In the nitride semiconductor laser and epitaxial substrate according to the above-described aspects of the present invention, preferably, an angle formed between the reference axis and the primary surface of the support base is in a range of one of 10 degrees to 80 degrees and 100 degrees to 170 degrees.

In the above-described aspects, when the tilt of the primary surface of the substrate or support base is within this angle range, the effective mass of holes become sufficiently small, and the benefit of the p-type cladding region, including the first and second p-type group III nitride semiconductor layers, is effectively brought out.

In the nitride semiconductor laser and epitaxial substrate according to the above-described aspects of the present invention, preferably, an angle formed between the reference axis and the primary surface of the support base is in a range of one of 63 degrees to 80 degrees and 100 degrees to 117 degrees.

In the above-described aspects, when the tilt of the primary surface of the substrate or support base lies within this angle range, the underlying semipolar surface on which the InAlGaN layer will be grown exhibits excellent indium incorporation property during InAlGaN growth. Excellent In incorporation makes it possible to grow InAlGaN of excellent crystallinity, such that n-type and p-type cladding regions are easily provided with the InAlGaN layer having good electrical conductivity.

The nitride semiconductor laser according to the above-mentioned aspects of the present invention can further comprise an electrode in a contact with the p-type nitride semiconductor region. The p-type nitride semiconductor region comprises a p-type contact region, the p-type contact region is provided on the p-type cladding region, and the p-type contact region forms a junction with the electrode; a thickness of the p-type contact region is smaller than 300 nm; and a band gap energy of the p-type cladding region is not less than a band gap energy of the p-type contact region.

In the above-described aspects, the p-type contact region is provided so as to have a carrier concentration which enables the p-type contact region to form an ohmic contact with the electrode. Holes are supplied from the p-type contact region, having a small band gap energy and small acceptor activation energy, to the low-resistivity second p-type group III nitride semiconductor layer. This helps reducing the driving voltage.

The nitride semiconductor laser according to the above-mentioned aspects of the present invention can further comprise an electrode in a contact with the p-type nitride semiconductor region. The p-type nitride semiconductor region comprises a p-type contact region, the p-type contact region is provided on the p-type cladding region, the p-type contact region forms a junction with the electrode, and a p-type dopant concentration of the second p-type group III nitride semiconductor layer is lower than a p-type dopant concentration in the p-type contact region.

In the above-described aspects, the p-type contact region is provided so as to have a carrier concentration which enables the p-type contact region to form an ohmic contact with the electrode. Holes from the p-type contact region are supplied to the second p-type group III nitride semiconductor layer with a low resistivity. This helps reducing the driving voltage. The contact resistance of the electrode can likewise be reduced.

In the nitride semiconductor laser and epitaxial substrate according to the above-described aspects of the present invention, preferably, a resistivity of the second p-type group III nitride semiconductor layer is smaller than a resistivity of the p-type contact region.

In the above-described aspects, when the p-type contact region is thinner than the second p-type group III nitride semiconductor layer in thickness, the increase in device resistance is reduced, and holes are supplied from the p-type contact region to the second p-type group III nitride semiconductor layer of low resistivity. This helps reducing the driving voltage. Further, the holes are supplied from the second p-type group III nitride semiconductor layer to the first p-type group III nitride semiconductor layer that includes anisotropic strain.

In the nitride semiconductor laser and epitaxial substrate according to the above-described aspects of the present invention, preferably, the second p-type group III nitride semiconductor layer comprises an InAlGaN layer that includes strain.

In the above-described aspects, when the second p-type group III nitride semiconductor layer comprises an InAlGaN layer, the InAlGaN layer forms a junction with the underlying AlGaN layer, and includes anisotropic strain. This strain can reduce the effective mass of the holes in the InAlGaN layer of the second p-type group III nitride semiconductor layer. The second p-type group III nitride semiconductor layer is provided with a desired band gap, independently from lattice matching between the first and second p-type group III nitride semiconductor layers.

In the nitride semiconductor laser and epitaxial substrate according to the above-described aspects of the present invention, the second p-type group III nitride semiconductor layer comprises a GaN layer.

The above-described aspects can receive a technical benefit of low resistivity from GaN and small effective mass from the AlGaN layer.

In the nitride semiconductor laser and epitaxial substrate according to the above-described aspects of the present invention, preferably, the active layer is provided so as to generate light having a wavelength of 480 nm to 550 nm.

In the above-described aspects, good optical confinement and low driving voltage can be provided in the above-mentioned wavelength range.

The nitride semiconductor laser and epitaxial substrate according to the above-described aspects of the present invention can further comprise an n-side InGaN optical guiding layer provided between the active layer and the support base, and a p-side InGaN optical guiding layer provided between the active layer and the p-type cladding region. Preferably, a thickness of the n-side InGaN optical guiding layer is larger than a thickness of the p-side InGaN optical guiding layer.

In the above-described aspects, the thickness of the n-side InGaN optical guiding layer is set to be larger than the thickness of the p-side InGaN optical guiding layer, and hence the optical waveguide as a whole can provide the light emitting device with good optical confinement even when a peak position of electric field profile of light propagating through the optical waveguide that comprises the active layer is shifted to the n-type region, and a refractive index of the p-type cladding region is made slightly higher than a desired value required for optical confinement in order to lower driving voltage.

The nitride semiconductor laser and epitaxial substrate according to the above-described aspects of the present invention can further comprise an n-side InGaN optical guiding layer provided between the active layer and the support base, and a p-side InGaN optical guiding layer provided between the active layer and the p-type cladding region. Preferably, an indium composition of the n-side InGaN optical guiding layer is larger than an indium composition of the p-side InGaN optical guiding layer.

In the above-described aspects, the indium composition of the n-side InGaN optical guiding layer is set to be greater than the indium composition of the p-side InGaN optical guiding layer. Therefore, the optical waveguide as a whole can be provided with good optical confinement in the light emitting device even when the peak position of electric field distribution of light which propagates through the optical waveguide that comprises the active layer is shifted to the n-type region, and the refractive index of the p-type cladding region is made slightly higher than a desired value for optical confinement in order to lower driving voltage.

The nitride semiconductor laser and epitaxial substrate according to the above-described aspects of the present invention can further comprise an n-side InGaN optical guiding layer provided between the active layer and the support base, and a p-side InGaN optical guiding layer provided between the active layer and the p-type cladding region. Preferably, the indium composition of the n-side InGaN optical guiding layer is 0.04 or greater.

In the above-described aspects, the indium compositions of the n-side and the p-side InGaN optical guiding layers are both 0.04 or greater, and hence the refractive indices of the InGaN optical guiding layers can be increased. Therefore, the optical waveguide as a whole can be provided with good optical confinement in the light emitting device.

The nitride semiconductor laser and epitaxial substrate according to the above-described aspects of the present invention can further comprise an n-side InGaN optical guiding layer provided between the active layer and the support base, and a p-side InGaN optical guiding layer provided between the active layer and the p-type cladding region. Preferably, a product of a thickness of the n-side InGaN optical guiding layer and the indium composition of the n-side InGaN optical guiding layer is larger than a product of a thickness of the p-side InGaN optical guiding layer and an indium composition of the p-side InGaN optical guiding layer, and the product of the thickness of the n-side InGaN optical guiding layer and the indium composition of the n-side InGaN optical guiding layer ranges from 2 to 10. The thickness of the n-side InGaN optical guiding layer can be expressed in units of nanometers, and the indium composition of the n-side InGaN optical guiding layer can be expressed in a molar ratio with respect to a group III constituent element.

In the above-described aspects, the product of the thickness and the indium composition of the n-side InGaN optical guiding layer is set to be larger than the product of the thickness and the indium composition of the p-side InGaN optical guiding layer. Therefore, the optical waveguide as a whole can be provided with excellent optical confinement in the light emitting device even when the peak position of electric field distribution of light propagating in the optical waveguide that comprises the active layer is shifted to the n-type region, and the refractive index of the p-type cladding region is made slightly higher than a value desired for optical confinement in order to lower driving voltage.

The nitride semiconductor laser and epitaxial substrate according to the above-described aspects of the present invention can further comprise a nitride semiconductor layer provided between the n-side InGaN optical guiding layer and the primary surface of the support base. Preferably, the n-side InGaN optical guiding layer is provided between the nitride semiconductor layer and the active layer, and a density of misfit dislocations at an interface between the n-side InGaN optical guiding layer and the nitride semiconductor layer ranges from $5 \times 10^3$ cm$^{-1}$ to $1 \times 10^5$ cm$^{-1}$.

In the above-described aspects, the InGaN optical guiding layer that is provided between the nitride semiconductor region and the active layer relaxes to the nitride semiconductor region, and hence anisotropic strain can be strengthened in the AlGaN layer of the first p-type group III nitride semiconductor layer.

The above object, other objects, features and advantages of the present invention will be made apparent more easily on the basis of the derailed description of preferred embodiments of the present invention as set forth below with reference to accompanying drawings.

BRIEF DESCRIPTION OF THE DRAWINGS

FIG. 1 is a schematic view illustrating the structure of a group III nitride semiconductor laser according to an embodiment;

FIG. 2 is a view illustrating a relationship among band gap Eg, p-type dopant concentration, and resistivity in a p-type cladding region for a group III nitride semiconductor laser according to an embodiment;

FIG. 3 is a schematic view illustrating structures to which first and second p-type group III nitride semiconductor layers of a p-type cladding region for a group III nitride semiconductor laser according to an embodiment can be applied;

DETAILED DESCRIPTION

Figure 4:
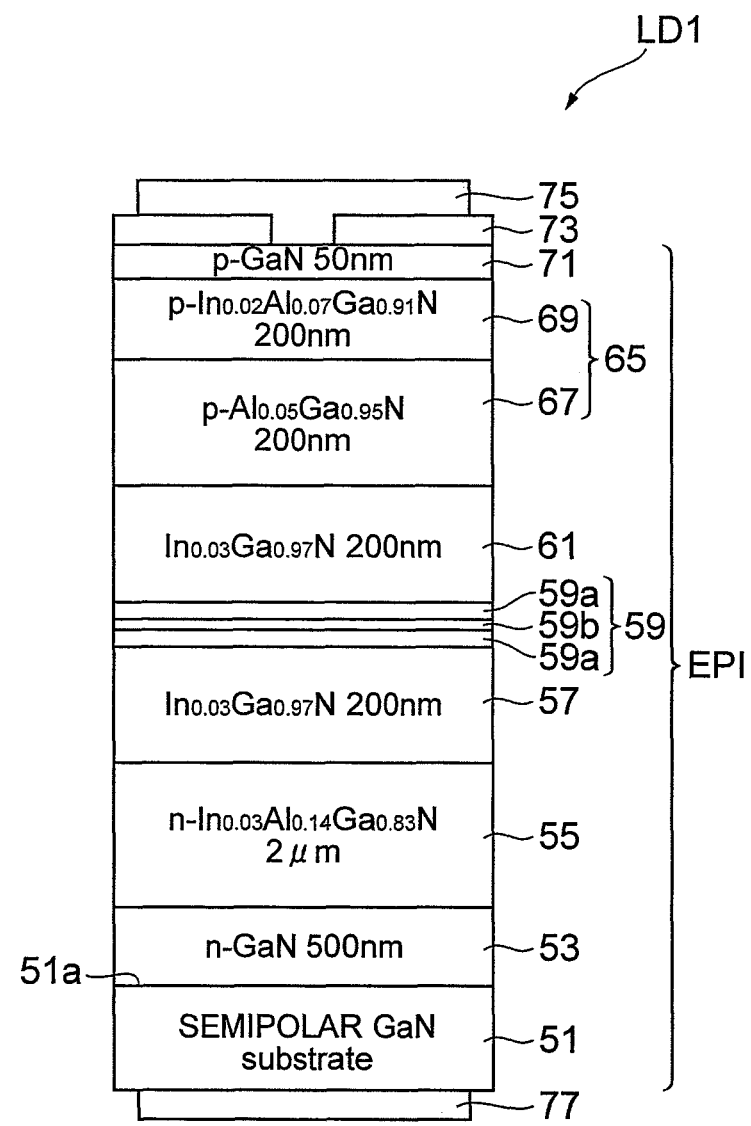
FIG. 4 is a schematic view illustrating the structure of a group III nitride semiconductor laser that is produced in Example 1.

The teachings of the present invention can be easily understood by referring to the following detailed description with reference to accompanying exemplary drawings.

With reference to accompanying drawings, embodiments of a nitride semiconductor laser, an epitaxial substrate and a method for fabricating a nitride semiconductor laser and epitaxial substrate according to the present invention will be described below. Identical portions are denoted by identical reference symbols, if possible.

FIG. 1 is a diagram illustrating schematically the structure of a group III nitride semiconductor laser according to the present embodiment. A group III nitride semiconductor laser 11 comprises a support base 17 and a semiconductor region 19. An epitaxial substrate EP for the group III nitride semiconductor laser 11 comprises a substrate in place of the support base 17, and a semiconductor stack layers in place of the semiconductor region 19. The laminate structure of the semiconductor stack layers is identical to the laminate structure of the semiconductor region 19. The epitaxial substrate EP comprises no electrode. The group III nitride semiconductor laser 11 has a gain guide-type structure, but the embodiment of the present invention is not limited to gain guide-type structures, and the present embodiment may be applied to a group III nitride semiconductor laser having, for instance, a ridge structure.

The group III nitride semiconductor laser 11 is explained below, and this description applies also to the epitaxial substrate EP for the group III nitride semiconductor laser 11. The support base 17 has conductivity. This conductivity has a value, for instance, of a magnitude as required in order to allow electric current to flow in the semiconductor laser 11. The support base 17 has a primary surface 17a and a back surface 17b. The primary surface 17a comprises a gallium nitride based semiconductor, for instance, hexagonal GaN. In a preferable example, the support base 17 can comprise a hexagonal group III nitride semiconductor, and may comprise a gallium nitride based semiconductor. The primary surface 17a is tilted with respect to a reference plane (for instance, a typical c-plane Sc) that is perpendicular to a reference axis extending in the direction of the c-axis of a gallium nitride based semiconductor (direction of a c-axis vector VC). The primary surface 17a is semipolar. The semiconductor region 19 is provided on the primary surface 17a of the support base 17.

The semiconductor region 19 comprises a light emitting layer 13, an n-type nitride semiconductor region 15a and a p-type nitride semiconductor region 15b. The light emitting layer 13, the n-type nitride semiconductor region 15a and the p-type nitride semiconductor region 15b are provided on the primary surface 17a of the support base 17. The n-type nitride semiconductor region 15a includes one or more gallium nitride based semiconductor layers, and can include, for instance, n-type GaN, n-type AlGaN, n-type InAlGaN or the like. The n-type nitride semiconductor region 15a can comprise a first cladding region 21. In the present example, the n-type nitride semiconductor region 15a includes the first cladding region 21. The explanation hereafter will refer to the first cladding region 21 instead of the n-type nitride semiconductor region 15a. The p-type nitride semiconductor region 15b comprises plural gallium nitride based semiconductor layers, and can comprise, for instance, p-type GaN, p-type InGaN, p-type AlGaN, p-type InAlGaN or the like. The p-type nitride semiconductor region 15b comprises a second cladding region 23. The semiconductor region 19 comprises the light emitting layer 13, the first cladding region 21 and the second cladding region 23. The light emitting layer 13 can comprise an active layer 25. The active layer 25 is provided on the primary surface 17a. The first cladding region (for instance, n-type cladding region) 21 and the second cladding region (for instance, p-type cladding region) 23 are provided on the primary surface 17a. The active layer 25 is provided between the support base 17 and the p-type nitride semiconductor region 15b and second cladding region 23. The first cladding region 21 can comprise one or more gallium nitride based semiconductor layers. The first cladding region 21 comprises preferably, for instance, n-type InAlGaN, and can comprise n-type GaN, n-type AlGaN or the like. The second cladding region 23 comprises plural gallium nitride based semiconductor layers, and in the present example, can include a first p-type group III nitride semiconductor layer 27 and a second p-type group III nitride semiconductor layer 29. The first p-type group III nitride semiconductor layer 27 comprises an AlGaN layer. This AlGaN layer incorporates anisotropic strain. In the anisotropically strained AlGaN layer, a degree of lattice mismatch defined in the axial direction of the projected c-axis on the primary surface 17a and the degree of lattice mismatch, defined in the in-plane of the primary surface 17a, in the axial direction perpendicular to the c-axis, are different from each other. The second p-type group III nitride semiconductor layer 29 comprises a semiconductor that is different from material of the abovementioned AlGaN layer, and for instance can comprise material of different constituent elements. In the second cladding region 23, the second p-type group III nitride semiconductor layer 29 comprises a p-type gallium nitride based semiconductor, for instance, p-type GaN, p-type InAlGaN or the like. The first p-type group III nitride semiconductor layer 27 is provided between the second p-type group III nitride semiconductor layer 29 and the active layer 25. A resistivity $\rho 29$ of the second p-type group III nitride semiconductor layer 29 is lower than a resistivity $\rho 27$ of the first p-type group III nitride semiconductor layer 27. The band gap of the AlGaN layer in the first p-type group III nitride semiconductor layer 27 is larger than the band gap of the second p-type group III nitride semiconductor layer 29, and is largest in the p-type cladding region 23.

In this nitride semiconductor laser 11, the second cladding region 23 includes the first and second p-type group III nitride semiconductor layers 27, 29 of mutually different materials. Both of the first and second p-type group III nitride semiconductor layers 27, 29 do not have any graded composition, and the second cladding region 23 can make the optical confinement properties excellent. The first p-type group III nitride semiconductor layer 27 is provided between the second p-type group III nitride semiconductor layer 29 and the active layer 25. Holes travel through the second p-type group III nitride semiconductor layer 29 having lower resistivity than the first p-type group III nitride semiconductor layer 27, and reach the first p-type group III nitride semiconductor layer 27.

Since a band gap E1 of the AlGaN layer of the first p-type group III nitride semiconductor layer 27 is largest in the p-type cladding region 23, strain in the p-type cladding region 23 can be increased in the AlGaN layer of the first p-type group III nitride semiconductor layer 27, causing the AlGaN layer to include significant anisotropic strain.

The AlGaN layer in the first p-type group III nitride semiconductor layer 27 includes anisotropic strain, and hence holes in the AlGaN layer have a smaller effective mass as compared to that of AlGaN that is grown on the c-plane. The holes reach the first p-type group III nitride semiconductor layer 27 to travel in the layer 27, and, although the resistivity of the AlGaN layer of the first p-type group III nitride semiconductor layer 27 is higher than the resistivity of the second p-type group III nitride semiconductor layer 29, the conduction of holes having the small effective mass in the AlGaN layer makes the dynamic electrical resistance of the AlGaN layer smaller than a value expected from resistivity of the first p-type group III nitride semiconductor layer 27. The forward driving voltage is reduced as a result.

Therefore, the present embodiment provides a semiconductor laser 11 that enables reduction of driving voltage while reducing deterioration in optical confinement performance, and provides an epitaxial substrate EP for the nitride semiconductor laser 11.

FIG. 2 is a set of diagrams illustrating a relationship among strain, resistivity, band gap Eg, and p-type dopant concentration in the two cladding layers 27, 29 of the p-type cladding region. Section (a) of FIG. 2 illustrates the relationship between strain and resistivity. The laser receives a technical benefit of electrical conduction resulting from the effective mass and resistivity of the two-layer cladding layer, while optical confinement as well is secured, through the use of the two-layer cladding layer.

With reference to FIG. 1, the semiconductor region 19 in the group III nitride semiconductor laser device 11 comprises a first end face 28a and a second end face 28b that intersect an m-n plane defined by the normal axis NX and the m-axis of the hexagonal group III nitride semiconductor. An electrode 39 is provided on the semiconductor region 19, and an electrode 41 is provided on the back surface 17b of the support base 17.

The first cladding layer 21, the second cladding layer 23 and the active layer 25 are arrayed along the normal axis NX of the semipolar primary surface 17a. The active layer 25 is provided between the first cladding layer 21 and the second cladding layer 23. The active layer 25 comprises a gallium nitride based semiconductor layer. The gallium nitride based semiconductor layer includes, for instance, well layers 25a. The active layer 25 comprises barrier layers 25b that comprises a gallium nitride based semiconductor, and the well layers 25a and the barrier layers 25b are arranged alternately. The well layers 25a comprises, for instance, InGaN, and the barrier layers 25b comprise, for instance, GaN, InGaN or the like. The use of the semipolar surface allows the active layer 25 comprising a quantum well structure to emit light having wavelength ranging from 430 nm to 570 nm. The semiconductor laser device 11 is appropriate for generation of light having a wavelength ranging from 480 nm to 550 nm, thereby providing excellent optical confinement and low driving voltage in the abovementioned wavelength range.

An orthogonal coordinate system S and a crystal coordinate system CR are depicted in the drawing. The normal axis NX is aligned to the Z-axis of the orthogonal coordinate system S. The primary surface 17a extends parallelly to a predetermined plane that is defined by the X-axis and the Y-axis of the orthogonal coordinate system S. FIG. 1 shows a typical c-plane Sc. In the example illustrated in FIG. 1, the c-axis of the group III nitride semiconductor of the support base 17 is tilted at a non-zero angle ALPHA with respect to the normal axis NX toward the m-axis of the group III nitride semiconductor.

The group III nitride semiconductor laser 11 further comprises an insulating film 31 and a p-type contact region 33. The p-type contact region 33 is provided on the p-type cladding region 23. The band gap energy of the p-type cladding region 23 is equal to or greater than the band gap energy of the p-type contact region 33. The p-type dopant concentration of the second p-type group III nitride semiconductor layer 29 is lower than the p-type dopant concentration of the p-type contact region 33. The insulating film 31 covers a surface 19a of the semiconductor region 19 (p-type contact region 33). The insulating film 31 has an opening 31a. The opening 31a extends in a direction of a line LIX of intersection of the abovementioned m-n plane with the surface 19a of the semiconductor region 19, and has a stripe shape, for example. The electrode 39 forms a contact with the surface 19a (for instance, p-type contact region 33) of the semiconductor region 19, via the opening 31a, and extends in the direction of the above-mentioned intersection line LIX. In the group III nitride semiconductor laser 11, the laser waveguide includes the first cladding layer 21, the second cladding layer 23 and the active layer 25, and extends in the direction of the abovementioned intersection line LIX.

In the group III nitride semiconductor laser 11, the first end face 28a and the second end face 28b intersect the m-n plane that is defined by the normal axis NX and the m-axis of the hexagonal group III nitride semiconductor. A laser cavity of the group III nitride semiconductor laser device 11 includes the first and second end faces 28a, 28b, such that the laser waveguide extends from one of the first and second end faces 28a, 28b to the other. The first and second end faces 28a, 28b are different from the cleavage planes thus far, i.e. the c-plane, the m-plane and the a-plane. In the group III nitride semiconductor laser 11, the first and second end faces 28a, 28b that constitute the laser cavity intersect the m-n plane. The laser waveguide extends along the direction of the line of intersection between the m-n plane and the semipolar surface 17a. The group III nitride semiconductor laser 11 has a laser cavity enabling low-threshold current and inter-band transition that makes low-threshold lasing in the emission of the active layer 25 active.

As illustrated in FIG. 1, dielectric multilayer films 43a, 43b can be provided on the first and second end faces 28a, 28b, respectively. An end-face coating may be used in the end faces 28a, 28b. Reflectance can be adjusted by way of the end-face coat.

The group III nitride semiconductor laser device 11 comprises an n-side optical guiding region 35 and a p-side optical guiding region 37. The n-side optical guiding region 35 can comprise one or more n-side optical guiding layers. The p-side optical guiding region 37 can comprise one or more p-side optical guiding layers. The n-side optical guiding region 35 comprises, for instance, an n-side first optical guiding layer 35a and an n-side second optical guiding layer 35b. The n-side optical guiding region 35 comprises, for instance, GaN, InGaN or the like. The p-side optical guiding region 37 comprises a p-side first optical guiding layer 37a and a p-side second optical guiding layer 37b. The p-side optical guiding region 37 comprises, for instance, GaN, InGaN or the like.

The second cladding region 23 is explained below. With respect to section (b) of FIG. 1, the first p-type group III nitride semiconductor layer 27 has a constant band gap energy E1, and the second p-type group III nitride semiconductor layer 29 has a constant band gap energy E2. Preferably, the band gap energy E1 is larger than the band gap energy E2. A refractive index n1 of the first p-type group III nitride semiconductor layer 27 is smaller than a refractive index n2 of the second p-type group III nitride semiconductor layer 29. Optical confinement in the p-side region can be improved as a result.

The first and second p-type group III nitride semiconductor layers 27, 29 are doped with p-type dopant, for instance, magnesium (Mg). Preferably, the magnesium concentration of the first p-type group III nitride semiconductor layer 27 is lower than the magnesium concentration of the second p-type group III nitride semiconductor layer 29. Increases in optical absorption loss caused by dopant absorption, and decreases in mobility caused by ion scattering of dopant ions can be reduced because the magnesium concentration of the first p-type group III nitride semiconductor layer 27 is lower than the magnesium concentration of the second p-type group III nitride semiconductor layer 29.

Since the band gap energy E1 of the first p-type group III nitride semiconductor layer 27 is made larger than the band gap energy E2 of the second p-type group III nitride semiconductor layer 29, this band gap relation can enhance the optical confinement performances thereof. Since the magnesium concentration of the first p-type group III nitride semiconductor layer 27 is made lower than the magnesium concentration of the second p-type group III nitride semiconductor layer 29, this concentration relation can reduce increases in absorption loss and deterioration in mobility in the first p-type group III nitride semiconductor layer 27.

Preferably, for instance, the band gap of the first p-type group III nitride semiconductor layer 27 ranges from 3.47 electron volts to 3.63 electron volts. The range of this band gap Eg corresponds to the wavelength range of 342 nm to 357 nm. Such a range can provide a refractive index appropriate for the confinement of light of a wavelength ranging from 480 nm to 550 nm. In this device, the first p-type group III nitride semiconductor layer 27 is closer to the active layer 25 than the second p-type group III nitride semiconductor layer 29, so that the above-described band gap value enables excellent optical confinement in the GaN-based light emitting device.

For instance, the magnesium concentration of the first p-type group III nitride semiconductor layer 27 can be $8 \times 10^{17}$ $cm^{-3}$ or higher. The magnesium concentration is within the above range decreases resistivity of the first p-type group III nitride semiconductor layer 27. The magnesium concentration of the first p-type group III nitride semiconductor layer 27 can be set to be $2\times10^{19}$ cm$^{-3}$ or lower. Decreases in mobility due to ion scattering is made not substantial by the magnesium concentration in the above range, and does not have a significantly influence on increase in the threshold current caused by absorption loss.

The magnesium concentration of the second p-type group III nitride semiconductor layer 29 can be set to be $7\times10^{18}$ cm$^{-3}$ or higher. The magnesium concentration within the above range increases the concentration of free hole. The magnesium concentration of the first p-type group III nitride semiconductor layer 27 can be set to be $5\times10^{19}$ cm$^{-3}$ or lower. The magnesium concentration exceeding the above range makes crystallinity readily worse to prevent a cladding layer thick enough for optical confinement from growing with excellent crystallinity.

Section (b) of FIG. 2 illustrates the relationship among strain, resistivity and band gap Eg. Using the two-layer cladding layer can provide a technical benefit on electrical conduction arising from effective mass and resistivity, and can also provide optical confinement on the basis of the profile of the band gap Eg (refractive index) as well.

Section (c) of FIG. 2 illustrates a relationship among strain, resistivity, band gap Eg and p-type dopant concentration of the p-type cladding region. Using the two-layer cladding layer can provide a technical benefit on electrical conduction arising from effective mass and resistivity, while optical confinement as well is secured on the basis of the profile of the band gap Eg (refractive index), preventing increases in the threshold current on the basis of the Mg dopant concentration profile and reducing the driving voltage The first p-type group III nitride semiconductor layer 27 is provided with a high band gap and a low dopant concentration. In addition thereto, it is, however, difficult to further provide low resistivity with the first p-type group III nitride semiconductor layer 27 because, when the hole density of the first p-type group III nitride semiconductor layer 27 is made increased, a lower resistivity resulting from increasing the p-type dopant concentration translates into an increase in carrier scattering due to p-type dopant ions.

Although the resistivity of the first p-type group III nitride semiconductor layer 27 is high, the dynamic electrical resistance can be reduced by dynamically increasing the hole concentration, because of mobility of AlGaN layer enhanced by anisotropic compressive strain incorporated therein. Injecting holes from the second p-type group III nitride semiconductor layer 29 of low-resistivity to the first p-type group III nitride semiconductor layer 27 during lasing operation enables to increase the hole concentration. In the laser, the hole concentration in the first p-type group III nitride semiconductor layer 27 that provides holes with the small effective mass can be increased, resulting in electrical resistance drop.

As described above, the p-type dopant concentration of the first p-type group III nitride semiconductor layer 27 is made lower than the p-type dopant concentration of the second p-type group III nitride semiconductor layer 29 to reduce the occurrence of ion scattering caused by the p-type dopant. This is effective in enhancing the mobility therein. A lower p-type dopant concentration translates into a lower optical absorption in the first p-type group III nitride semiconductor layer 27.

FIG. 3 is a set of diagrams illustrating a possible structure of the first and second p-type group III nitride semiconductor layers of the p-type cladding region. The second p-type group III nitride semiconductor layer 29 forms a junction 30a with the first p-type group III nitride semiconductor layer 27. In the present example, the first p-type group III nitride semiconductor layer 27 forms a junction 30b with the underlying optical guiding layer. The second p-type group III nitride semiconductor layer 29 forms a junction 30c with the contact layer 33. It is thought that, when the AlGaN provided on the semipolar surface includes anisotropic strain which is unreleased, this strain removes the degeneracy of energy levels of valence bands thereof to decrease the hole effective mass. For instance, the Al composition of the AlGaN of the first p-type group III nitride semiconductor layer 27 can range from 0.02 to 0.1. The thickness of AlGaN in the first p-type group III nitride semiconductor layer 27 can range, for instance, from 100 nm to 500 nm. When the thickness of the AlGaN of the first p-type group III nitride semiconductor layer 27 is in the above range, relaxation does not occur therein to provide the layer with excellent optical confinement.

As illustrated in section (a) of FIG. 3, in the second p-type group III nitride semiconductor layer 29 comprising GaN, reducing the resistivity of the second p-type group III nitride semiconductor layer 29 is easier as compared with a ternary or quaternary nitride semiconductor. That is, technical contributions of low resistivity from GaN and small effective mass from the AlGaN layer are produced in the embodiment.

As shown in section (b) of FIG. 3, the second p-type group III nitride semiconductor layer 29 comprises InAlGaN, and forms the junction 30a with the underlying AlGaN layer 27. The effective mass of holes in the second p-type group III nitride semiconductor layer 29 decreases due to anisotropic strain when the AlGaN layer of the first p-type group III nitride semiconductor layer 27 includes anisotropic strain. The reduction in effective mass is effectual in terms of facilitating the inflow of hole into the first p-type group III nitride semiconductor layer 27 from the second p-type group III nitride semiconductor layer 29. That is, technical contributions of low resistivity of the InAlGaN layer and small effective mass from the AlGaN layer are produced in the embodiment.

As shown in section (c) of FIG. 3, the second p-type group III nitride semiconductor layer 29 comprises at least either InAlGaN and GaN. The AlGaN layer 27 includes anisotropic strain. This facilitates the inflow of hole into the first p-type group III nitride semiconductor layer 27 from the second p-type group III nitride semiconductor layer 29.

In a quaternary nitride semiconductor, the band gap and the lattice constant can be set independently from each other, as compared with a ternary nitride semiconductor. This is useful for adjusting lattice mismatch. In order to make the band gap Eg large, the Al composition and In composition of InAlGaN have to be increased, and lattice matching in InAlGaN, however, is complex. In InAlGaN provided on a semipolar surface, lattice matching to GaN is not possible simultaneously in both the tilt direction of the c-axis (hereafter, "off-direction") and a direction perpendicular to the off-direction, because the lattice constant ratio c/a in GaN, AlN and InN is different from each other. Relaxation of InAlGaN prevents the effective mass from lowering.

In the p-type cladding region illustrated in section (a), section (b) and section (c) of FIG. 3, no misfit dislocations substantial enough to give rise to relaxation are produced at the interface between the first and second p-type group III nitride semiconductor layers 27, 29. Although the second cladding region 23 is grown on the light emitting layer 13, no misfit dislocations substantial enough to cause relaxation are formed at the interface between the second cladding region 23 and the light emitting layer 13.

In a structure in which the first p-type group III nitride semiconductor layer 27 comprises AlGaN, a nitride as a ternary compound is smaller than a nitride as a quaternary compound in terms of scattering factor. In InAlGaN of a given band gap and AlGaN having a band gap identical to that of the InAlGaN, the Al composition of the AlGaN is lower than the Al composition of the InAlGaN, and the growth temperature of AlGaN can be made higher than the growth temperature of InAlGaN. The higher growth temperature can reduce the incorporation of oxygen during AlGaN growth as compared with InAlGaN growth, thereby reducing the occurrence of carrier scattering caused by impurities such as oxygen or the like. For instance, the oxygen concentration of AlGaN can be $3 \times 10^{17}$ (3E+17) cm$^{-3}$ or less. For the above reasons, the mobility of AlGaN can be increased to be comparable to or higher than that in InAlGaN.

The semiconductor region 19 on the support base 17 comprises the group III nitride semiconductor layers (21, 13, 23, 33) that are arranged in the direction of the axis NX normal to the primary surface 17a of the support base 17. Plural junctions (interfaces) at which these group III nitride semiconductor layers are formed are included in the semiconductor region 19. In one example, misfit dislocations not enough to cause relaxation are formed at these interfaces. Accordingly, when the primary surface 17a of the support base 17 comprises, for instance, GaN, each group III nitride semiconductor layer in the semiconductor region 19 includes strain associated with the difference between the lattice constant of the respective layer and the lattice constant of GaN.

(Lattice Matching Form 1)

In the support base 17 of a GaN substrate, a lattice constant D1(GaN) of the c-axis of the GaN substrate has a parallel component D1(GaN)p to the primary surface 17a of the support base 17 and a component D1(GaN)n normal to the primary surface 17a of the support base 17. A lattice constant D1(InAlGaN) of the c-axis of the InAlGaN layer of the second p-type group III nitride semiconductor layer 29 has a component D1(InAlGaN)p parallel to the primary surface 17a of the support base 17 and a component D1(InAlGaN)n normal to the primary surface 17a of the support base 17. When a degree of lattice mismatch R1p in the InAlGaN layer is defined as (D1(InAlGaN)p−D1(GaN)p)/D1(GaN)p, the degree of lattice mismatch R1p ranges from −0.15% to +0.2%.

In this structure, misfit dislocations is not formed in the second p-type group III nitride semiconductor layer 29 having a band gap large enough so that cladding can be configured. The above condition indicates that a lattice constant relating to the c-axis among the two crystal axes for lattice-matching is matched. The other axis (a-axis or m-axis) of the second p-type group III nitride semiconductor layer 29 is strained. By virtue of this anisotropic strain, the abovementioned effect of effective mass reduction can be achieved.

(Lattice Matching Form 2)

In the support base 17 of a GaN substrate, a lattice constant D2(GaN) in a crystal axis (a-axis or m-axis) that is perpendicular to the c-axis of the GaN substrate has a component D2(GaN)p parallel to the primary surface 17a of the support base 17 and a component D2(GaN)n normal to the primary surface 17a of the support base 17. A lattice constant D2(InAlGaN) in a crystal axis perpendicular to the c-axis of the InAlGaN layer of the second p-type group III nitride semiconductor layer 29 has a component D2(InAlGaN)p parallel to the primary surface 17a of the support base 17 and a component D2(InAlGaN)n normal to the primary surface 17a of the support base 17. When a degree of lattice mismatch R2p in the InAlGaN layer is defined as (D2(InAlGaN)p−D2(GaN)p)/D2(GaN)p, the degree of lattice mismatch R2p ranges from −0.15% to +0.2%. When the off-direction is exactly the a-axis or the m-axis, D2(GaN)n and D2(InAl-GaN)n are zero. When the off-direction deviates slightly from the a-axis or the m-axis, then D2(GaN)n and D2(InAlGaN)n have very small values, close to zero.

In this structure, the cladding region has a large band gap, but no misfit dislocations are formed at the interface between the second p-type group III nitride semiconductor layer 29 and the underlying AlGaN layer 27. The above condition indicates that the lattice constant perpendicular to the c-axis among the two crystal axes for lattice matching is matched. The second p-type group III nitride semiconductor layer 29 is also strained in the c-axis direction. By virtue of this anisotropic strain, the abovementioned effect of effective mass reduction can be achieved.

(Lattice Matching Form 3)

In the support base 17 of a GaN substrate, the c-axis of the GaN substrate is tilted with respect to either crystal axis of the a-axis or the m-axis of the GaN substrate (herein, the m-axis). The lattice constant D1(GaN) for the c-axis of the GaN substrate has the component D1(GaN)p parallel to the primary surface 17a of the support base 17 and the component D1(GaN)n normal to the primary surface 17a of the support base 17. The lattice constant D1(InAlGaN) for the c-axis of the InAlGaN layer of the second p-type group III nitride semiconductor layer 29 has the component D1(InAlGaN)p parallel to the primary surface 17a of the support base 17 and the component D1(InAlGaN)n normal to the primary surface 17a of the support base 17. The degree of lattice mismatch R1p of the InAlGaN layer is defined by (D1(InAlGaN)p−D1(GaN)p)/D1(GaN)p. The degree of lattice mismatch R1p ranges from −0.15% to 0%. In a structure in which the c-axis is tilted in a direction therefrom to the m-axis, the degree of lattice mismatch R2p in the InAlGaN layer of the first p-type group III nitride semiconductor layer 27 is defined as (D2(InAlGaN)p−D2(GaN)p)/D2(GaN)p, for the a-axis. The degree of lattice mismatch R2p ranges from 0% to 0.2%. Herein, D2(InAlGaN)p is perpendicular to D1(InAlGaN)p, and D2(GaN)p is perpendicular to D1(GaN)p.

In this structure, neither of the crystal axes from among the two crystal axes pertaining to lattice matching is matched. That is, both crystal axes are strained to a certain small degree. In InAlGaN of the second p-type group III nitride semiconductor layer 29 that has a band gap large enough to configure a cladding, when lattice matching relating to one of the crystal axes is obtained, the degree of lattice mismatch of the other crystal axis increases and relaxation may occur in the InAlGaN of the second p-type group III nitride semiconductor layer 29. In such an InAlGaN, no lattice matching for both crystal axes occur, providing InAlGaN with a composition for lowering the degree of lattice mismatch is effective in preventing relaxation. Anisotropic strain relating to both axes can also provide the abovementioned effective mass reduction.

The cladding region functions so as to confine light into an optical waveguide located inner. When the second cladding region 23 (p-type cladding region) comprises two semiconductor layers, using only one of the semiconductor layers for the p-type cladding region cannot sufficiently provide optical confinement, but the total thickness of the two semiconductor layers in the second cladding region 23 is made thick enough for optical confinement, such that the combination of these two layers can provide sufficient optical confinement.

Preferably, for instance, a thickness d23 (FIG. 1) of the second cladding region 23 ranges from 300 nm to 1000 nm. The second cladding region 23 having a thickness d23 of 300 nm or greater can improve optical confinement in the light emitting layer 13 and suppress the penetration of light to the p-type contact region 33 and the electrode 39. The thickness d23 of the second cladding region 23 that is equal to 1000 nm or less prevents increases in driving voltage in addition to increases in the series-resistance.

The first and second p-type group III nitride semiconductor layers 27, 29 have the thickness d1 and d2, respectively. Preferably, the thickness d2 of the second p-type group III nitride semiconductor layer 29 satisfies $0.2 \leq d2/(d1+d2) \leq 0.6$. When the thickness d2 of the second p-type group III nitride semiconductor layer 29 has a value within the above range, the second p-type group III nitride semiconductor layer 29, together with the first p-type group III nitride semiconductor layer 27 that has the remaining thickness d1, provides excellent optical confinement and low driving voltage. The low resistivity of the second p-type group III nitride semiconductor layer 29, which has the thickness d2 in the abovementioned range, helps reduce the driving voltage, whereas the low effective mass of the first p-type group III nitride semiconductor layer 27, which has the remaining thickness of the abovementioned range, helps likewise reduce the driving voltage. The thicknesses within the abovementioned range for the first and second p-type group III nitride semiconductor layers 27, 29 are larger than the thickness of the contact region 33 that is necessary for forming excellent contact with the electrode 39.

The thickness of the first p-type group III nitride semiconductor layer 27 is smaller than the critical film thickness of the material of the first p-type group III nitride semiconductor layer 27, whereby relaxation of the first p-type group III nitride semiconductor layer 27 can be avoided as a result. The thickness of the second p-type group III nitride semiconductor layer 29 is smaller than the critical film thickness of the second p-type group III nitride semiconductor layer 29, whereby relaxation of the second p-type group III nitride semiconductor layer 29 can be avoided.

As already explained, the primary surface 17a of the support base 17 (substrate of the epitaxial substrate EP) is semipolar. Preferably, the angle ALPHA formed between the primary surface (substrate primary surface of the epitaxial substrate EP) 17a and a reference axis Cx ranges from 10 degrees to 80 degrees or from 100 degrees to 170 degrees. When the tilt of the primary surface 17a of the support base 17 lies within this angle range, the effective mass of hole become sufficiently small, and the benefit of the p-type cladding region 23 that include the first and second p-type group III nitride semiconductor layers 27, 29 is effectively brought out.

Preferably, the angle ALPHA formed between the primary surface 17a and a reference axis Cx ranges from 63 degrees to 80 degrees or from 100 degrees to 117 degrees. When the tilt of the primary surface 17a lies within this angle range, the underlying semipolar surface (i.e. the primary surface 17a) for growing the InAlGaN layer that is used in cladding has an excellent indium incorporation in the growth of InAlGaN. Excellent In incorporation makes it possible to grow InAlGaN with excellent crystallinity, such that n-type and p-type cladding structures are provided with an InAlGaN layer having excellent electrical conductivity. Herein, preferably, the c-axis is tilted in the direction from the c-axis to the m-axis of the gallium nitride based semiconductor.

Returning to FIG. 1, the p-type contact region 33 is provided so as to form a junction with the second cladding region 23, and the electrode 39 is provided so as to form a junction with the p-type contact region 33. The thickness of the p-type contact region 33 can be, for instance, smaller than 300 nm, and the thickness of the p-type contact region 33 can be, for instance, 10 nm or greater. The p-type dopant concentration of the p-type contact region 33 can be, for instance, $5 \times 10^{20}$ (5E+20) cm$^{-3}$ or less. The p-type dopant concentration of the p-type contact region 33 can be for instance, $1 \times 10^{19}$ (1E+19) cm$^{-3}$ or more.

Preferably, the resistivity of the second p-type group III nitride semiconductor layer 29 is smaller than the resistivity of the p-type contact region 33. Herein, when the p-type contact region 33 is thinner than the second p-type group III nitride semiconductor layer 29 in thickness, the increase in device resistance is reduced and holes are supplied from the p-type contact region 33 to the low-resistivity second p-type group III nitride semiconductor layer 29. This works better for reducing the driving voltage. Further, the holes are supplied from the second p-type group III nitride semiconductor layer 29 to the first p-type group III nitride semiconductor layer 27 that includes anisotropic strain.

Preferably, in the second cladding region 23, the band gap energy E2 of the second p-type group III nitride semiconductor layer 29 is equal to or greater than the band gap energy Ec of the p-type contact region 33. Holes from the p-type contact region 33 that has a small band gap energy and small acceptor activation energy are supplied to the low-resistivity second p-type group III nitride semiconductor layer 29, so that such a structure works better for reducing driving voltage.

In the n-type nitride semiconductor region 15a that is provided between the InGaN optical guiding layer 35 and the primary surface 17a of the support base 17, an InGaN optical guiding layer 35 is provided between the n-type nitride semiconductor region 15a and the active layer 13. In a given example, the density of misfit dislocations at the interface between the InGaN optical guiding layer 35 and the n-type nitride semiconductor region 15a (interface 20a illustrated in FIG. 1) ranges preferably from $5 \times 10^3$ cm$^{-1}$ to $1 \times 10^5$ cm$^{-1}$. In this form, since the InGaN optical guiding layer 33, which is provided between the n-type nitride semiconductor region 15a and the active layer 13, relaxes with respect to the n-type nitride semiconductor region 15a, it becomes possible to strengthen anisotropic strain in the AlGaN layer of the first p-type group III nitride semiconductor layer 27. A similar effect can be provided even if misfit dislocations are introduced in the interface between the n-side first optical guiding layer 35a and the n-side second optical guiding layer 35b.

In the example, preferably, the n-type cladding region 21 comprises an InAlGaN layer, and the Al composition of the AlGaN layer of the first p-type group III nitride semiconductor layer 27 is lower than the Al composition of the InAlGaN layer of the n-type cladding region 21. In this form, since the n-type cladding region 21 comprises the InAlGaN layer, the strain included in the InAlGaN layer of the n-type cladding region 21 can be made smaller than the strain included in the AlGaN layer of the first p-type group III nitride semiconductor layer 27, whereby. In consequence, relaxation of the InAlGaN layer of the n-type cladding region 21 can be suppressed, and it is possible, as a result, to prevent decrease in strain of the AlGaN layer of the first p-type group III nitride semiconductor layer 27 caused by relaxation in the InAlGaN layer of the n-type cladding region 21.

Example 1

Figure 5:
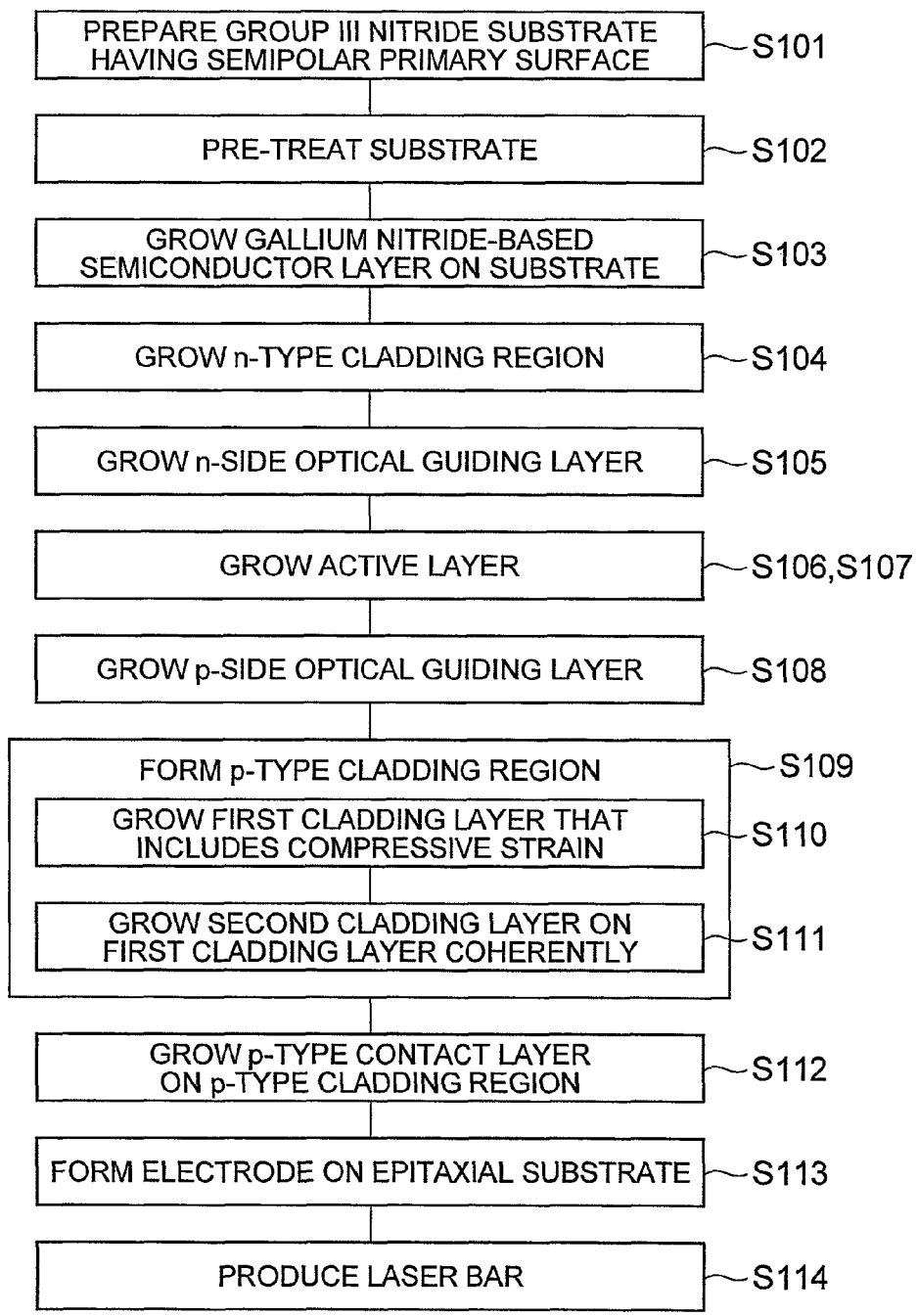
FIG. 5 is a diagram illustrating a process flow in the fabrication of the group III nitride semiconductor laser according to Example 1.

FIG. 4 is a diagram illustrating schematically the structure of a group III nitride semiconductor laser in Example 1. The group III nitride semiconductor laser is produced according to the process flow illustrated in FIG. 5.

In step S101, a group III nitride substrate is prepared, and has a semipolar primary surface. In the present example, a GaN substrate 51 having a semipolar primary surface tilted by an angle of 75 degrees with respect to the m-axis direction is prepared. The plane orientation of the semipolar primary surface corresponds to the (20-21) plane. A semiconductor region having an LD structure LD1 that works in the 520 nm wavelength band of lasing is grown on the semipolar primary surface of the GaN substrate 51.

In step S102, the GaN substrate 51 is placed in a growth reactor, and, thereafter, the GaN substrate 51 is subjected to a pre-treatment (thermal cleaning). This pre-treatment is performed in an atmosphere, which contains ammonia and hydrogen, under conditions of thermal treatment temperature of 1050 degrees Celsius, and treatment time 10 minutes.

After the pre-treatment, in step S103, a gallium nitride based semiconductor layer, such as the n-type GaN layer 53, is grown on the GaN substrate 51 at a growth temperature of 1050 degrees Celsius. The thickness of the n-type GaN layer 53 is, for instance, 500 nm. In step S104, an n-type cladding region is grown on the gallium nitride based semiconductor layer. For instance, the n-type cladding region comprises an InAlGaN layer 55, which is grown at a growth temperature of 840 degrees Celsius. The thickness of this n-type cladding region is, for instance, 2 μm. The n-type InAlGaN layer 55 incorporates anisotropic strain. In step S105, an n-side optical guiding layer is grown on the n-type cladding region. In the present example, for instance, the n-side optical guiding layer comprises an n-type InGaN layer 57, which is grown at a growth temperature of 840 degrees Celsius. The thickness of the n-type InGaN layer 57 is, for instance, 200 nm. The n-type InGaN layer 57 incorporates compressive strain.

In the next step, an active layer 59 is grown on the n-side optical guiding layer. The active layer 59 comprises barrier layers and a well layer. In the present example, the barrier layers are grown in step S106 and the well layer is grown in step S107. The barrier layers, for instance, include GaN layers 59a that are grown at a growth temperature of 840 degrees Celsius. The thickness of the GaN layers 59a is, for instance, 15 nm. For instance, the well layer comprises an $In_{0.3}Ga_{0.7}N$ layer 59b that is grown at a growth temperature of 790 degrees Celsius. The thickness of the InGaN layer 59b is, for instance, 3 nm. The InGaN layer 59b includes compressive strain.

In step S108, a p-side optical guiding layer 61 is grown on the active layer 59. In the present embodiment, for instance, the p-side optical guiding layer 61 comprises an InGaN layer 61 that is grown at a growth temperature of 840 degrees Celsius. The thickness of the p-side InGaN layer 61 is, for instance, 200 nm. The p-side InGaN layer 61 includes compressive strain.

In step S109, a p-type cladding region 65 is grown on the p-side optical guiding layer 61. In the growth of the p-type cladding region 65, firstly, in step S110, a first cladding layer is grown in such a way so as to form a junction with the p-side optical guiding layer. The first cladding layer corresponds to a p-type $Al_{0.05}Ga_{0.95}N$ layer 67. For instance, the p-type $Al_{0.05}Ga_{0.95}N$ layer 67 is grown at a growth temperature of 840 degrees Celsius. The thickness of the p-type $Al_{0.05}Ga_{0.95}N$ layer 67 is, for instance, 200 nm. The p-type $Al_{0.05}Ga_{0.95}N$ layer 67 forms a junction in the p-side optical guiding layer, and incorporates anisotropic strain. The resistivity of the p-type $Al_{0.05}Ga_{0.95}N$ layer 67 is, for instance, 25 Ωcm. The band gap energy of the p-type $Al_{0.05}Ga_{0.95}N$ layer 67 is 3.54 eV. The Mg concentration of the p-type $Al_{0.05}Ga_{0.95}N$ layer 67 is, for instance, $3\times10^{18}$ cm$^{-3}$.

In the growth of the p-type cladding region 65, in step S111 next, a second cladding layer is grown coherently in such a way so as to form a junction with the first cladding layer. In the growth of the second cladding layer, a p-type $In_{0.02}Al_{0.07}Ga_{0.91}N$ layer 69 is grown thereon. For instance, the p-type $In_{0.02}Al_{0.07}Ga_{0.91}N$ layer 69 is grown at a growth temperature of 840 degrees Celsius. The thickness of the p-type $In_{0.02}Al_{0.07}Ga_{0.91}N$ layer 69 is, for instance, 200 nm. The p-type $In_{0.02}Al_{0.07}Ga_{0.91}N$ layer 69 forms a junction with the first cladding layer, and incorporates anisotropic strain. The InAlGaN of the first cladding layer has a degree of lattice mismatch of −0.1% with GaN, in the a-axial direction, and a degree of lattice mismatch of −0.2% with GaN in the direction in which the c-axis is tilted. The InAlGaN of the second cladding layer is substantially lattice-matched with GaN in the a-axial direction, and has a degree of lattice mismatch of −0.08% with GaN in a tilt direction of the c-axis.

In the present example, the resistivity of the p-type $In_{0.02}Al_{0.07}Ga_{0.91}N$ layer 69 is, for instance, 8 Ωcm. The band gap energy of the p-type $In_{0.02}Al_{0.07}Ga_{0.91}N$ layer 69 is 3.48 eV, which is smaller than the band gap value of the p-type $Al_{0.05}Ga_{0.95}N$ layer 67. The Mg concentration of the p-type $In_{0.02}Al_{0.07}Ga_{0.91}N$ layer 69 is, for instance, $1\times10^{19}$ cm$^{-3}$, which is greater than the value of the p-type $Al_{0.05}Ga_{0.95}N$ layer 67. Herein, 1 eV corresponds to $1.602\times10^{-19}$ Joules.

In step S112, a p-type contact layer 71 is formed thereon, and has such dopant concentration and thickness so as to form an ohmic junction with the p-type cladding region 65. In the present example, for instance, the p-type contact layer 71 comprises a GaN layer that is grown at a growth temperature of 1000 degrees Celsius. The thickness of the p-type contact layer 71 is, for instance, 50 nm. The resistivity of p-type GaN in the p-type contact layer 71 is, for instance, 10 Ωcm, and the Mg concentration of the p-type contact layer 71 is, for instance, $1\times10^{20}$ cm$^{-3}$. An epitaxial substrate EP1 is formed as a result of the above steps.

In step S113, an insulating film is formed on the p-type contact layer 71, and a stripe window that extends in the direction of the laser waveguide is formed by wet etching in the insulating film to form a protective insulating layer 73. The width of the stripe window is, for instance, 10 μm. An anode electrode 75 is formed on the p-type contact layer 71 and the protective insulating layer 73, and a cathode electrode 77 is formed on the back surface of the GaN substrate. The anode electrode 75 is in contact with the p-type contact layer 71 through the stripe window. The anode electrode 75 includes an ohmic electrode comprising Ni/Au and a pad electrode comprising Ti/Au, these films are formed by vapor deposition. The substrate is polished down to a substrate thickness of about 80 μm, and the cathode electrode 77 is formed thereafter. The cathode electrode 77 includes an ohmic electrode comprising Ti/Al and a pad electrode comprising Ti/Au. The films are formed by vapor deposition. Through the above steps, a substrate product is formed from the epitaxial substrate EP1.

In step S114, a laser bar is produced from the substrate product. The cavity length of the laser bar is 600 μm. A dielectric multilayer film is formed on the end face of the laser bar. The dielectric multilayer film comprises, for instance, a multilayer film of $SiO_2/TiO_2$.

Separately from the production of the above-described LD structure, there is produced the LD structure LC1 that comprises a p-type cladding region of a single p-type cladding layer (p-type $Al_{0.05}Ga_{0.95}N$ layer, thickness 400 nm). The LD structure LC1 has the same structure as the LD structure LD1, except for the structure of the above p-type cladding region.

Figure 6:
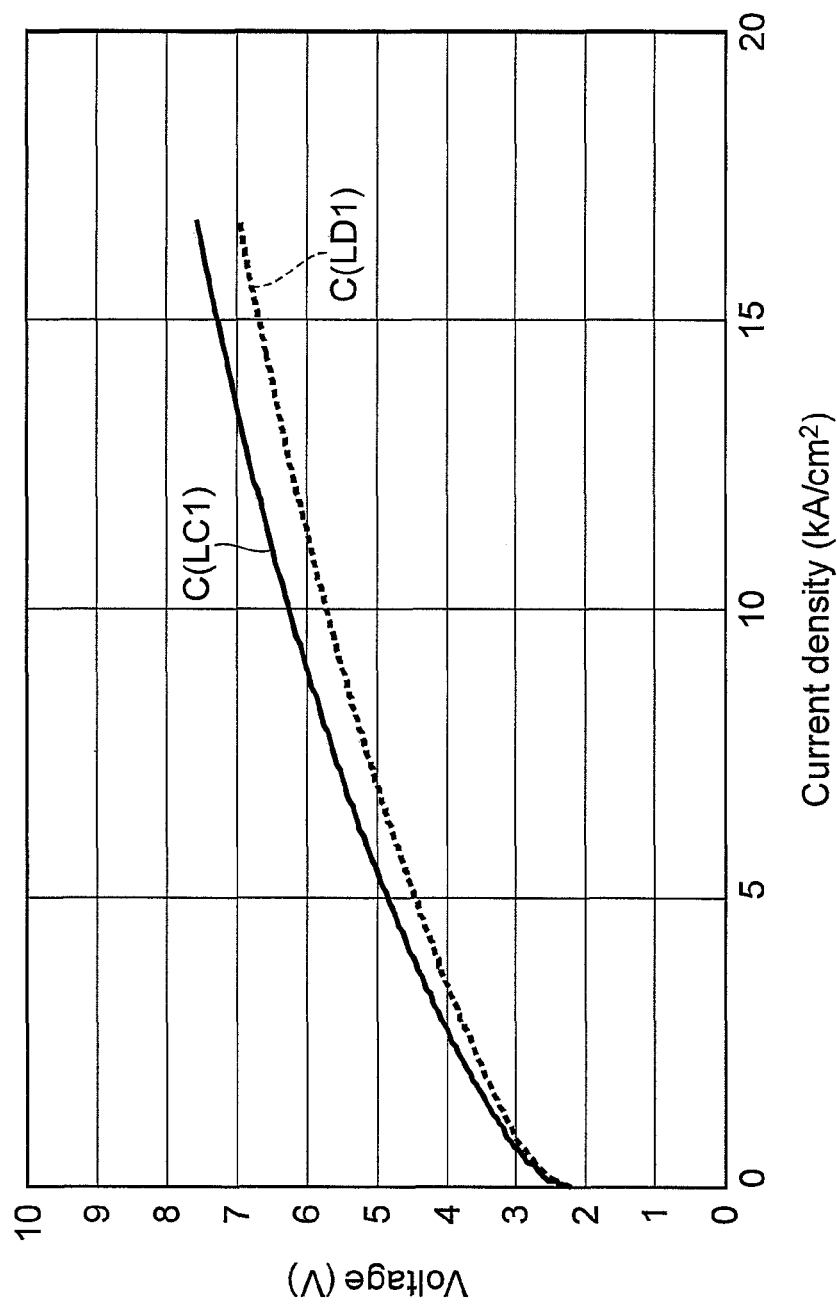
FIG. 6 is a view illustrating a driving characteristic (I-V curve) of a semiconductor laser LD1 of Example 1 and a semiconductor laser LC1.

FIG. 6 is a diagram illustrating a driving characteristic (J-V curve) of the semiconductor laser LD1 and the semiconductor laser LC1 of Example 1. FIG. 6 illustrates a driving characteristic C (LC1) of the semiconductor laser LC1 comprising a single p-type AlGaN cladding layer of a constant composition profile (p-type $Al_{0.05}Ga_{0.95}N$ layer, thickness 400 nm), and a driving characteristic C (LD1) of the semiconductor laser LD1 that comprises a p-type AlGaN cladding layer with anisotropic strain (p-type $Al_{0.05}Ga_{0.95}N$ layer, thickness 200 nm) and a p-type InAlGaN cladding layer with anisotropic strain (p-type $In_{0.02}Al_{0.07}Ga_{0.91}N$ layer, thickness 200 nm). A comparison between the driving characteristic C (LD1) and the driving characteristic C (LC1) reveals that a forward driving voltage Vf (LD1) of the driving characteristic C (LD1) is lower as compared with the forward driving voltage Vf (LC1) of the driving characteristic C (LC1). The decrease in Vf cannot be explained as being just the effect of using p-type InAlGaN of resistivity lower than that of p-type AlGaN, and involves some additional action, since, in both devices, a differential resistance dV/dJ is about 2E-4 $\Omega cm^2$, which is one order of magnitude lower than the value expected on the basis of the resistivity of the p-type AlGaN cladding layer. Observation of cross-sectional TEM did not reveal any misfit dislocations of the interface between the p-side optical guiding layer and the p-type cladding region, the interface between the p-type cladding region and the p-type contact layer, or the interface between these two cladding regions.

Although, in the semiconductor laser LD1 and the semiconductor laser LC1, the resistivity (25 $\Omega cm$) of the first-layer p-type $Al_{0.05}Ga_{0.95}N$ layer in the p-type cladding region is comparatively high, the J-V curve of the FIG. 6 shows that the dynamic resistance in the semiconductor laser LD1 reduces during driving. One of the reasons for the reduction in the dynamic resistance may be as follows: the effective mass of carriers in the AlGaN layer that includes anisotropic strain is made small in terms of the semipolar character; and carriers inflowing from the second-layer p-type InAlGaN cladding layer (or p-type GaN) having a large carrier concentration efficiently flow. It is through that this effect is provided in a pronounced manner, by a cladding region, which comprises a plurality of layers (for instance, two-layers), having a combination of an AlGaN layer that includes anisotropic strain, and another p-type cladding layer (i.e. of low resistivity) that forms a junction with the AlGaN layer and that has a large hole concentration.

Example 2

Figure 7:
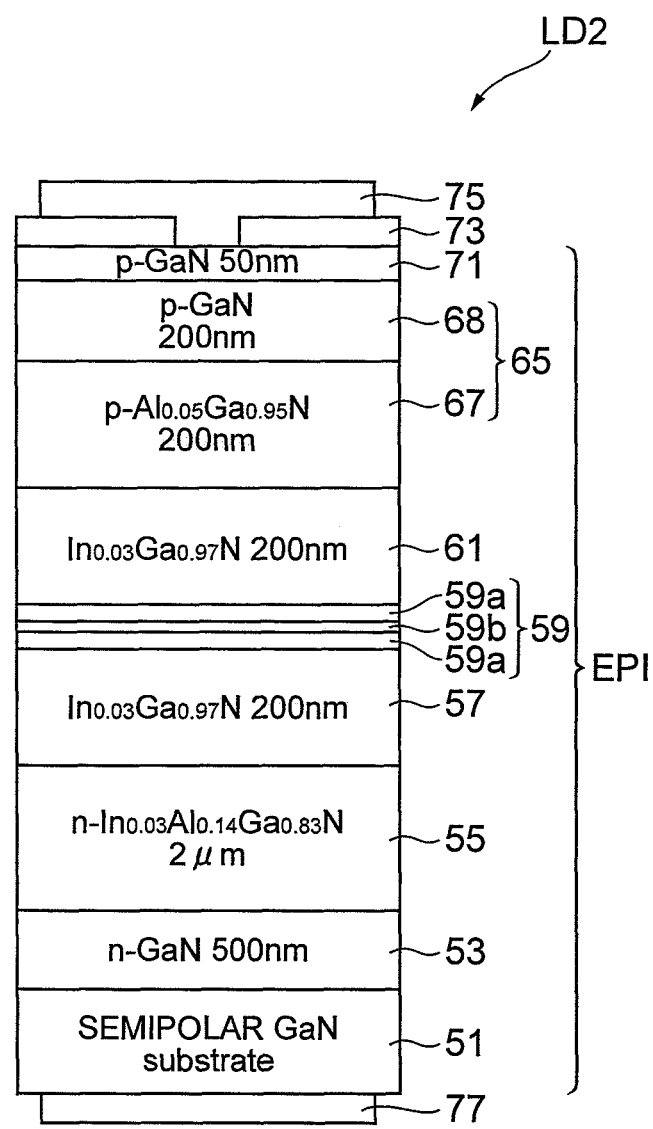
FIG. 7 is a schematic view illustrating the structure of a group III nitride semiconductor laser that is produced in Example 2.

FIG. 7 is a diagram illustrating schematically the structure of a group III nitride semiconductor laser that is produced in Example 2. In a semiconductor laser LD2 in Example 2, a p-type GaN layer 68 is grown instead of the InAlGaN layer 69 of the second cladding layer in the semiconductor laser LD1. The resistivity of the p-type GaN layer 68 of the second cladding layer is, for instance, 3 $\Omega cm$, and the Mg concentration of the p-type GaN layer 68 is, for instance, $1 \times 10^{19}$ $cm^{-3}$. In a comparison with the semiconductor laser LD1 of the Example 1 at an injection current of 12 $kA/cm^2$, the driving voltage Vf of the semiconductor laser LD2 drops by 0.4 volts with respect to the driving voltage Vf of the semiconductor laser LD1.

Example 3

Figure 8:
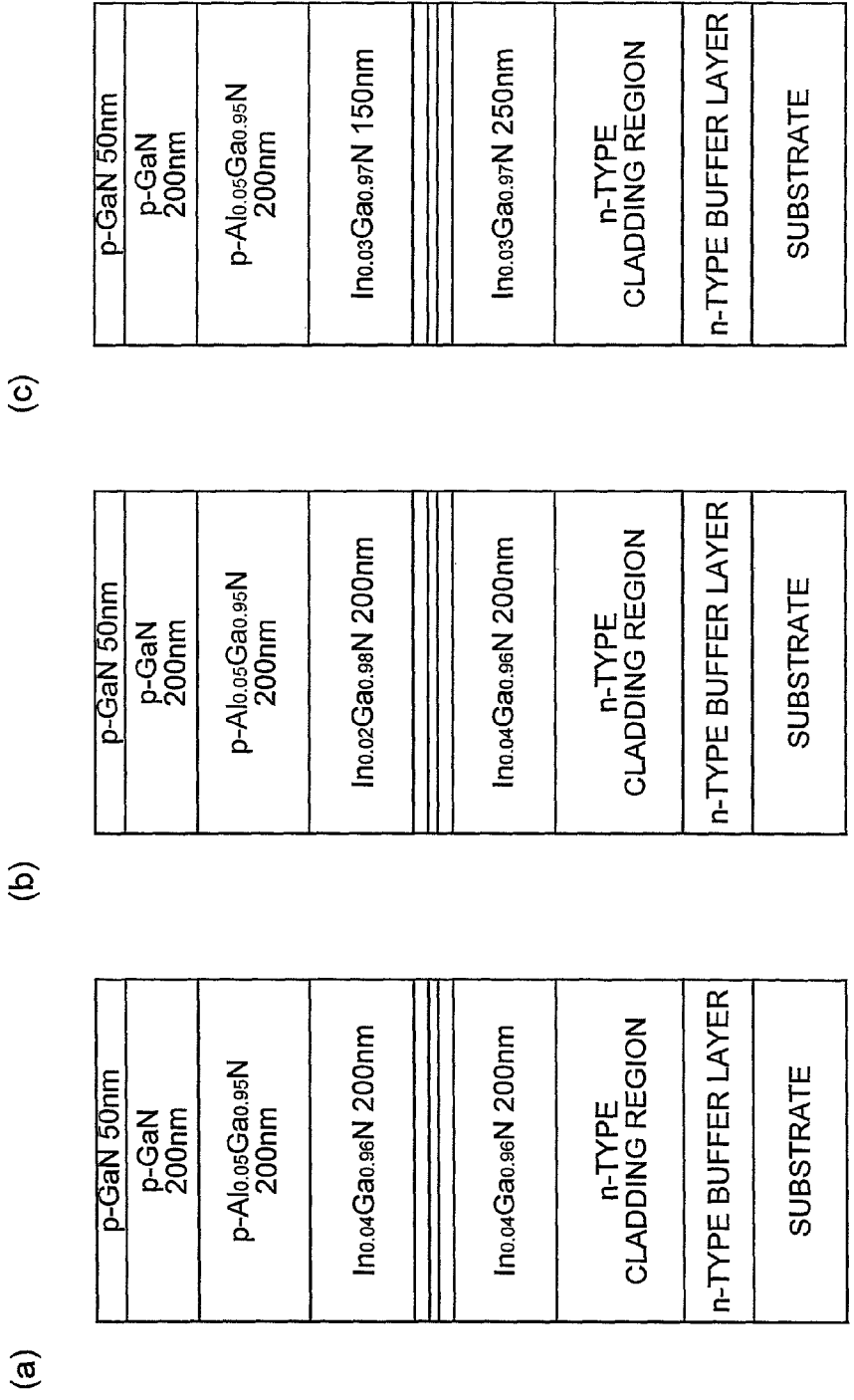
FIG. 8 is a schematic view illustrating the structures for a group III nitride semiconductor laser that is produced in Example 3.

FIG. 8 is a set of diagrams illustrating schematically the structure of a group III nitride semiconductor laser that is produced in Example 3. With reference to sections (a), (b) and (c) of FIG. 8, the p-type cladding region comprises a p-type AlGaN cladding layer that forms a junction with the light emitting layer, and a p-type GaN cladding layer that forms a junction with the p-type AlGaN cladding layer.

The effect of the reduction in threshold current can be achieved by modifying the structure of the optical guiding layer from the optical guiding layer in the Example 2 that uses a p-type GaN layer in the second cladding layer. Preferably, as illustrated in section (a) of FIG. 8, the indium compositions in the InGaN of the p-side and n-side optical guiding layers are set to a value greater than 0.03, for instance 0.04 or greater. In the example, since the indium compositions in the n-side and the p-side InGaN optical guiding layers are equal to or higher than the abovementioned value, the refractive indices of the InGaN optical guiding layers can be increased. Hence, the light emitting device can be provided with excellent optical confinement in the optical waveguide as a whole.

In another example, as illustrated in section (b) of FIG. 8, it is preferable that the indium composition of the n-side InGaN optical guiding layer be larger than the indium composition of the p-side InGaN optical guiding layer. Herein, the product of the thickness and indium composition of the n-side InGaN optical guiding layer is 8, and the product of the thickness and indium composition of the p-side InGaN optical guiding layer is 4, and the comparison therebetween shows that the value of the n-side InGaN optical guiding layer is thus larger. In the present example, since the indium composition of the n-side InGaN optical guiding layer is set to be greater than the indium composition of the p-side InGaN optical guiding layer, the light emitting device can be provided with excellent optical confinement in the optical waveguide as a whole even when the peak of electric field profile of light that propagates through the optical waveguide comprising the active layer is shifted toward the n-type region, and the refractive index of the p-type cladding region is slightly higher than a desired value for optical confinement for low driving voltage. This structure can demonstrate sufficient optical confinement even if the refractive index of the p-type cladding region is slightly high. Adopting an asymmetric indium composition profile in the p-side and n-side optical guiding layers can make the tolerance for deviations from design values wider, as compared with a structure in which the indium composition of the optical guiding layer is made increased.

In yet another example, as illustrated in section (c) of FIG. 8, it is preferable that the thickness of the n-side InGaN optical guiding layer be larger than the thickness of the p-side InGaN optical guiding layer. Herein, the product of the thickness and the indium composition of the n-side InGaN optical guiding layer is 7.5 and the product of the thickness and the indium composition of the p-side InGaN optical guiding layer is 4.5, and the comparison therebetween shows that the value of the n-side InGaN optical guiding layer is thus larger. In this example, since the thickness of the n-side InGaN optical guiding layer is set to be larger than the thickness of the p-side InGaN optical guiding layer, the optical waveguide as a whole in the light emitting device can be provided with excellent optical confinement in even when the peak of electric field profile of light propagating through the optical waveguide that comprises the active layer is shifted toward the n-type region and the refractive index of the p-type cladding region for low driving voltage is slightly higher than a desired value for optical confinement.

In the example, preferably, the product of the thickness of the n-side InGaN optical guiding layer and the indium composition of the n-side InGaN optical guiding layer is larger than the product of the thickness of the p-side InGaN optical guiding layer and the indium composition of the p-side InGaN optical guiding layer, and the product of the thickness of the n-side InGaN optical guiding layer and the indium composition of the n-side InGaN optical guiding layer ranges from 2 to 10. Herein, the thickness of the n-side InGaN optical guiding layer are expressed in units of nanometers, and indium composition of the n-side InGaN optical guiding layer is expressed as the molar ratio with respect to the group III constituent element. In the example, since the product of the thickness and indium composition of the n-side InGaN optical guiding layer is set to be larger than the product of the thickness and indium composition of the p-side InGaN optical guiding layer, the light emitting device can be provided with excellent optical confinement in the optical waveguide as a whole even when the peak of electric field distribution of light propagating through the optical waveguide that comprises the active layer shifts toward the n-type region and the refractive index of the p-type cladding region for low driving voltage is slightly higher than a desired value for optical confinement.

In Example 3, an instance has been explained wherein the second cladding layer is a GaN layer, but the same technical contribution is obtained in a case where the second cladding layer is InAlGaN.

Example 4

In the structure of FIG. 8, the n-side optical guiding layer is located below the active layer, and the p-side optical guiding layer is located above the active layer. In the structure of section (a) of FIG. 8, the composition and thickness of the n-side optical guiding layer are identical to the composition and thickness of the p-side optical guiding layer, and the two optical guiding structures that sandwich the active layer are made symmetrical. A structure in which the thickness and/or composition of the two optical guiding layers that sandwich the active layer are different from each other, i.e. an asymmetric structure, may also be adopted. Section (b) and section (c) of FIG. 8 illustrate structures in which the thicknesses or compositions of two optical guiding layers that sandwich an active layer are dissimilar, i.e. asymmetric structures. Such asymmetric InGaN guide structures allow the n-side InGaN layer to relax in the direction in which the c-axis tilts. This relaxation enables strengthening of anisotropy of the strain in the AlGaN cladding layer, and allows further enhancement in mobility in the AlGaN cladding layer. In that structure, misfit dislocations are introduced at the interface between the n-side InGaN layer and an underlying nitride layer. This interface is spaced apart from the well layer when the density of misfit dislocations is within a range from $5 \times 10^3$ cm$^{-1}$ to $1 \times 10^5$ cm$^{-1}$, and hence there is little impairment of emission characteristics.

As explained above, a nitride semiconductor laser is provided in which driving voltage can be reduced while reducing deterioration in optical confinement. The present embodiment provides also an epitaxial substrate for such a nitride semiconductor laser.

Having described and illustrated the principle of the invention in a preferred embodiment thereof, it is appreciated by those having skill in the art that the invention can be modified in arrangement and detail without departing from such principles. The present invention is not limited to any particular configuration disclosed in the embodiments. We therefore claim all modifications and variations coming within the spirit and scope of the following claims.

What is claimed is:

1. A nitride semiconductor laser comprising:
a support base having conductivity, the support base including a primary surface, the primary surface comprising a gallium nitride based semiconductor;
an active layer provided on the primary surface; and
a p-type nitride semiconductor region provided on the primary surface,
the primary surface being tilted with respect to a reference plane, the reference plane being perpendicular to a reference axis, the reference axis extending in a direction of a c-axis of the gallium nitride based semiconductor,
the active layer being provided between the support base and the p-type nitride semiconductor region,
the p-type nitride semiconductor region including a p-type cladding region,
the p-type cladding region including a first p-type group III nitride semiconductor layer and a second p-type group III nitride semiconductor layer,
the first p-type group III nitride semiconductor layer being provided between the second p-type group III nitride semiconductor layer and the active layer,
the first p-type group III nitride semiconductor layer including an AlGaN layer,
the second p-type group III nitride semiconductor layer comprising material different from material of the AlGaN layer of the first p-type group III nitride semiconductor layer,
the AlGaN layer including anisotropic strain,
the AlGaN layer of the first p-type group III nitride semiconductor layer having a largest band gap energy in the p-type cladding region, and
the second p-type group III nitride semiconductor layer having a resistivity lower than a resistivity of a first p-type group III nitride semiconductor layer,
wherein a thickness of the p-type cladding region ranges from 300 nm to 1000 nm, and the first and second p-type group III nitride semiconductor layers have thicknesses d1 and d2, respectively, such that the thickness of the second p-type group III nitride semiconductor layer satisfies a relation: $0.2 \leq d2/(d1+d2) \leq 0.6$,
the first p-type group III nitride semiconductor layer being in physical contact with the second p-type group III nitride semiconductor layer,
the material of the first p-type group III nitride semiconductor layer is AlGaN, and
the first p-type group III nitride semiconductor layer is made of AlGaN and does not include any other layer of material different from AlGaN.

2. The nitride semiconductor laser according to claim 1, further comprising an n-type cladding region provided between the active layer and the primary surface of the support base,
the n-type cladding region comprising an InAlGaN layer; and
the AlGaN layer of the first p-type group III nitride semiconductor layer having an Al composition lower than an Al composition of the InAlGaN layer of the n-type cladding region.

3. The nitride semiconductor laser according to claim 1, wherein a band gap energy of the first p-type group III nitride semiconductor layer is larger than a band gap energy of the second p-type group III nitride semiconductor layer.

4. The nitride semiconductor laser according to claim 1, wherein a band gap energy of the first p-type group III nitride semiconductor layer ranges from 3.47 electron volts to 3.63 electron volts.

5. The nitride semiconductor laser according to claim 1, wherein the first and second p-type group III nitride semiconductor layers are doped with magnesium (Mg), and the first p-type group III nitride semiconductor layer has a magnesium concentration lower than a magnesium concentration of the second p-type group III nitride semiconductor layer.

6. The nitride semiconductor laser according to claim 1, wherein a magnesium concentration of the first p-type group III nitride semiconductor layer ranges from $8\times10^{17}$ cm$^{-3}$ to $2\times10^{19}$ cm$^{-3}$.

7. The nitride semiconductor laser according to claim 1, wherein an angle formed between the reference axis and the primary surface of the support base is in a range of one of 10 degrees to 80 degrees and 100 degrees to 170 degrees.

8. The nitride semiconductor laser according to claim 1, wherein an angle formed between the reference axis and the primary surface of the support base is in a range of one of 63 degrees to 80 degrees and 100 degrees to 117 degrees.

9. The nitride semiconductor laser according to claim 1, further comprising an electrode in contact with the p-type nitride semiconductor region,
the p-type nitride semiconductor region comprising a p-type contact region, the p-type contact region being provided on the p-type cladding region, and the p-type contact region forming a junction with the electrode,
a thickness of the p-type contact region being smaller than 300 nm, and
a band gap energy of the p-type cladding region being not less than a band gap energy of the p-type contact region.

10. The nitride semiconductor laser according to claim 1, further comprising an electrode in contact with the p-type nitride semiconductor region,
the p-type nitride semiconductor region comprising a p-type contact region, the p-type contact region being provided on the p-type cladding region, and the p-type contact region forming a junction with the electrode, and
a p-type dopant concentration of the second p-type group III nitride semiconductor layer being lower than a p-type dopant concentration in the p-type contact region.

11. The nitride semiconductor laser according to claim 10, wherein a resistivity of the second p-type group III nitride semiconductor layer is smaller than a resistivity of the p-type contact region.

12. The nitride semiconductor laser according to claim 1, wherein the second p-type group III nitride semiconductor layer includes an InAlGaN layer, and the InAlGaN layer includes strain.

13. The nitride semiconductor laser according to claim 1, wherein the second p-type group III nitride semiconductor layer includes a GaN layer.

14. The nitride semiconductor laser according to claim 1, wherein the active layer is provided so as to emit light having a wavelength of 480 nm to 550 nm.

15. The nitride semiconductor laser according to claim 1, further comprising:
an n-side InGaN optical guiding layer provided between the active layer and the support base; and
a p-side InGaN optical guiding layer provided between the active layer and the p-type cladding region,
a thickness of the n-side InGaN optical guiding layer being larger than a thickness of the p-side InGaN optical guiding layer.

16. The nitride semiconductor laser according to claim 1, further comprising:
an n-side InGaN optical guiding layer provided between the active layer and the support base; and
a p-side InGaN optical guiding layer provided between the active layer and the p-type cladding region,
an indium composition of the n-side InGaN optical guiding layer being larger than an indium composition of the p-side InGaN optical guiding layer.

17. The nitride semiconductor laser according to claim 1, further comprising:
an n-side InGaN optical guiding layer provided between the active layer and the support base; and
a p-side InGaN optical guiding layer provided between the active layer and the p-type cladding region,
an indium composition of the n-side InGaN optical guiding layer being 0.04 or greater.

18. The nitride semiconductor laser according to claim 1, further comprising:
an n-side InGaN optical guiding layer provided between the active layer and the support base; and
a p-side InGaN optical guiding layer provided between the active layer and the p-type cladding region,
a product of a thickness of the n-side InGaN optical guiding layer and an indium composition of the n-side InGaN optical guiding layer being larger than a product of a thickness of the p-side InGaN optical guiding layer and an indium composition of the p-side InGaN optical guiding layer, and
the product of the thickness of the n-side InGaN optical guiding layer and the indium composition of the n-side InGaN optical guiding layer ranging from 2 to 10, the thickness of the n-side InGaN optical guiding layer being expressed in terms of nanometers, and the indium composition of the n-side InGaN optical guiding layer being expressed in terms of a molar ratio of the group III constituent elements thereof.

19. The nitride semiconductor laser according to claim 15, further comprising a nitride semiconductor layer provided between the n-side InGaN optical guiding layer and the primary surface of the support base,
the n-side InGaN optical guiding layer being provided between the nitride semiconductor layer and the active layer, and a density of misfit dislocations at an interface between the n-side InGaN optical guiding layer and the nitride semiconductor layer ranging from $5\times10^3$ cm$^{-1}$ to $1\times10^5$ cm$^{-1}$.

20. An epitaxial substrate for a nitride semiconductor laser, comprising:
a substrate having a primary surface, the primary surface comprising a gallium nitride based semiconductor; an active layer provided on the primary surface; and
a p-type nitride semiconductor region provided on the primary surface,
the primary surface being tilted with respect to a reference plane, the reference plane being perpendicular to a reference axis, and the reference axis extending in a direction of a c-axis of the gallium nitride based semiconductor,
the active layer being provided between the substrate and the p-type nitride semiconductor region,
the p-type nitride semiconductor region comprising a p-type cladding region,
the p-type cladding region including a first p-type group III nitride semiconductor layer and a second p-type group III nitride semiconductor layer,
the first p-type group III nitride semiconductor layer being provided between the second p-type group III nitride semiconductor layer and the active layer,
the first p-type group III nitride semiconductor layer comprising an AlGaN layer,
the second p-type group III nitride semiconductor layer being different from the AlGaN layer of the first p-type group III nitride semiconductor layer,
the AlGaN layer including anisotropic strain, a band gap of the AlGaN layer of the first p-type group III nitride semiconductor layer being largest in the p-type cladding region, and the second p-type group III nitride semiconductor layer having a resistivity lower than a resistivity of a first p-type group III nitride semiconductor layer, wherein a thickness of the p-type cladding region ranges from 300 nm to 1000 nm, and the first and second p-type group III nitride semiconductor layers have thicknesses d1 and d2, respectively, such that the thickness of the second p-type group III nitride semiconductor layer satisfies a relation: $0.2 \leq d2/(d1+d2) \leq 0.6$, the first p-type group III nitride semiconductor layer being in physical contact with the second p-type group III nitride semiconductor layer, the material of the first p-type group III nitride semiconductor layer is AlGaN, and the first p-type group III nitride semiconductor layer is made of AlGaN and does not include any other layer of material different from AlGaN.

21. The epitaxial substrate according to claim 20, further comprising:

an n-type cladding region provided between the primary surface of the substrate and the active layer, the n-type cladding region including an InAlGaN layer, and an Al composition of the AlGaN layer of the first p-type group III nitride semiconductor layer being lower than an Al composition of the InAlGaN layer of the n-type cladding region.

22. The epitaxial substrate according to claim 21, further comprising an InGaN optical guiding layer provided between the active layer and the substrate, a density of misfit dislocations at an interface between the InGaN optical guiding layer and the n-type cladding region ranging from $5 \times 10^3$ cm$^{-1}$ to $1 \times 10^5$ cm$^{-1}$.

23. The epitaxial substrate according to claim 20, wherein the p-type nitride semiconductor region comprises a p-type contact region provided on the p-type cladding region, a thickness of the p-type contact region is smaller than 300 nm, and a band gap energy of the p-type cladding region is not less than a band gap energy of the p-type contact region.

24. The epitaxial substrate according to claim 20, wherein the p-type nitride semiconductor region includes a p-type contact region provided on the p-type cladding region, and a p-type dopant concentration of the second p-type group III nitride semiconductor layer is lower than a p-type dopant concentration of the p-type contact region.

* * * * *